United States Patent
Kim et al.

(10) Patent No.: US 11,981,501 B2
(45) Date of Patent: May 14, 2024

(54) LOADING CASSETTE FOR SUBSTRATE INCLUDING GLASS AND SUBSTRATE LOADING METHOD TO WHICH SAME IS APPLIED

(71) Applicant: ABSOLICS INC., Covington, GA (US)

(72) Inventors: Sungjin Kim, Suwanee, GA (US); Youngho Rho, Daejeon (KR); Jincheol Kim, Hwaseong-si (KR); Byungkyu Jang, Suwon-si (KR)

(73) Assignee: Absolics Inc., Covington, GA (US)

( * ) Notice: Subject to any disclaimer, the term of this patent is extended or adjusted under 35 U.S.C. 154(b) by 443 days.

(21) Appl. No.: 17/433,342

(22) PCT Filed: Mar. 12, 2020

(86) PCT No.: PCT/KR2020/003480
§ 371 (c)(1),
(2) Date: Aug. 24, 2021

(87) PCT Pub. No.: WO2020/185020
PCT Pub. Date: Sep. 17, 2020

(65) Prior Publication Data
US 2022/0048699 A1    Feb. 17, 2022

Related U.S. Application Data

(60) Provisional application No. 62/826,122, filed on Mar. 29, 2019, provisional application No. 62/826,105, (Continued)

(51) Int. Cl.
*B65D 85/48* (2006.01)
*H01L 21/673* (2006.01)
*H01L 21/677* (2006.01)

(52) U.S. Cl.
CPC .......... *B65D 85/48* (2013.01); *H01L 21/6732* (2013.01); *H01L 21/677* (2013.01)

(58) Field of Classification Search
CPC .... B65D 85/48; H01L 21/6732; H01L 21/677
(Continued)

(56) References Cited

U.S. PATENT DOCUMENTS

| 4,835,598 A | 5/1989 | Higuchi et al. |
| 5,304,743 A | 4/1994 | Sen et al. |

(Continued)

FOREIGN PATENT DOCUMENTS

| CN | 1317163 A | 10/2001 |
| CN | 1614464 A | 5/2005 |

(Continued)

OTHER PUBLICATIONS

International Search Report dated Jul. 1, 2020 in counterpart International Patent Application No. PCT/KR2020/003480 (2 pages in English and 2 pages in Korean).

(Continued)

*Primary Examiner* — Jacob K Ackun
(74) *Attorney, Agent, or Firm* — NSIP Law

(57) ABSTRACT

An embodiment relates to a loading cassette and a target substrate loading method to which same is applied. The loading cassette according to the embodiment comprises: an upper plate; a lower plate facing the upper plate while having a space therebetween; an edge support part for connecting the upper plate to the lower plate and supporting the left and right edges of a target substrate; and a rear surface support part for connecting the upper plate to the lower plate and supporting the center and the rear surface-edge of the target substrate.

10 Claims, 15 Drawing Sheets

Related U.S. Application Data filed on Mar. 29, 2019, provisional application No. 62/826,144, filed on Mar. 29, 2019, provisional application No. 62/816,995, filed on Mar. 12, 2019, provisional application No. 62/816,984, filed on Mar. 12, 2019.

(58) Field of Classification Search
USPC .......................................................... 206/454
See application file for complete search history.

(56) References Cited

U.S. PATENT DOCUMENTS

| | | | |
|---|---|---|---|
| 5,414,222 | A | 5/1995 | Sen et al. |
| 6,610,934 | B2 | 8/2003 | Yamaguchi et al. |
| 8,774,580 | B2 | 7/2014 | Bolle |
| 9,167,694 | B2 | 10/2015 | Sundaram et al. |
| 9,263,370 | B2 | 2/2016 | Shenoy et al. |
| 9,420,708 | B2 | 8/2016 | Hibino et al. |
| 9,768,090 | B2 | 9/2017 | Liang et al. |
| 10,483,210 | B2 | 11/2019 | Gross et al. |
| 2002/0093120 | A1 | 7/2002 | Magni et al. |
| 2002/0180015 | A1 | 12/2002 | Yamaguchi et al. |
| 2003/0179341 | A1* | 9/2003 | Choo ................. G02F 1/1333 349/187 |
| 2006/0179341 | A1 | 8/2006 | Harrod |
| 2006/0182556 | A1* | 8/2006 | Liu ..................... B65D 85/48 414/331.01 |
| 2006/0202322 | A1 | 9/2006 | Kariya et al. |
| 2006/0226094 | A1* | 10/2006 | Cho ..................... B65G 49/062 211/41.18 |
| 2008/0017407 | A1 | 1/2008 | Kawano |
| 2008/0217761 | A1 | 9/2008 | Yang et al. |
| 2009/0117336 | A1 | 5/2009 | Usui et al. |
| 2010/0224524 | A1* | 9/2010 | Yuasa .................. B65D 85/48 206/454 |
| 2012/0106117 | A1 | 5/2012 | Sundaram et al. |
| 2012/0153463 | A1 | 6/2012 | Maeda |
| 2012/0186866 | A1 | 7/2012 | Mikado et al. |
| 2013/0050227 | A1 | 2/2013 | Petersen et al. |
| 2013/0069251 | A1 | 3/2013 | Kunimoto et al. |
| 2013/0293482 | A1 | 11/2013 | Burns et al. |
| 2014/0034374 | A1 | 2/2014 | Cornejo et al. |
| 2014/0085847 | A1 | 3/2014 | Takizawa |
| 2014/0116763 | A1 | 5/2014 | Sato et al. |
| 2014/0116767 | A1 | 5/2014 | Sato et al. |
| 2014/0326686 | A1* | 11/2014 | Li ........................ B65D 85/48 211/41.1 |
| 2015/0027757 | A1 | 1/2015 | Shin et al. |
| 2015/0235915 | A1 | 8/2015 | Liang et al. |
| 2015/0235936 | A1 | 8/2015 | Yu et al. |
| 2015/0235989 | A1 | 8/2015 | Yu et al. |
| 2015/0245486 | A1 | 8/2015 | Shin et al. |
| 2016/0111380 | A1 | 4/2016 | Sundaram et al. |
| 2016/0286660 | A1 | 9/2016 | Gambino et al. |
| 2016/0300740 | A1* | 10/2016 | Xu ...................... H01L 21/6734 |
| 2016/0351545 | A1 | 12/2016 | Hong et al. |
| 2017/0040265 | A1 | 2/2017 | Park et al. |
| 2017/0064835 | A1 | 3/2017 | Ishihara et al. |
| 2017/0144844 | A1* | 5/2017 | Dong ................. H01L 21/67715 |
| 2017/0154860 | A1 | 6/2017 | Hareyama |
| 2017/0179013 | A1 | 6/2017 | Kunimoto |
| 2017/0186710 | A1 | 6/2017 | Yoon et al. |
| 2017/0223825 | A1 | 8/2017 | Thadesar et al. |
| 2017/0363580 | A1 | 12/2017 | Ahmad et al. |
| 2017/0363850 | A1* | 12/2017 | Quarre ................. G02B 21/34 |
| 2018/0068868 | A1 | 3/2018 | Jaramillo et al. |
| 2018/0139844 | A1 | 5/2018 | You |
| 2018/0226351 | A1 | 8/2018 | Park et al. |
| 2018/0240778 | A1 | 8/2018 | Liu et al. |
| 2018/0342450 | A1 | 11/2018 | Huang et al. |
| 2018/0342451 | A1 | 11/2018 | Dahlberg et al. |
| 2019/0269013 | A1 | 8/2019 | Takagi et al. |
| 2023/0062692 | A1* | 3/2023 | Park ..................... B65D 85/48 |

FOREIGN PATENT DOCUMENTS

| | | |
|---|---|---|
| CN | 101039549 A | 9/2007 |
| CN | 101189921 A | 5/2008 |
| CN | 101371355 A | 2/2009 |
| CN | 101415626 A | 4/2009 |
| CN | 102097330 A | 6/2011 |
| CN | 102106198 A | 6/2011 |
| CN | 102122691 A | 7/2011 |
| CN | 102246299 A | 11/2011 |
| CN | 102844857 A | 12/2012 |
| CN | 103188866 A | 7/2013 |
| CN | 103208480 A | 7/2013 |
| CN | 106029286 A | 10/2016 |
| CN | 106449574 A | 2/2017 |
| CN | 107112297 A | 8/2017 |
| CN | 107683524 A | 2/2018 |
| CN | 107758041 A | 3/2018 |
| CN | 107848878 A | 3/2018 |
| CN | 108878343 A | 11/2018 |
| CN | 109411432 A | 3/2019 |
| EP | 0 526 456 B1 | 8/1998 |
| EP | 1 988 758 A1 | 11/2008 |
| EP | 3 083 125 B1 | 10/2016 |
| JP | 2000-142876 A | 5/2000 |
| JP | 2001-7531 A | 1/2001 |
| JP | 3173250 B2 | 3/2001 |
| JP | 2004-311919 A | 11/2004 |
| JP | 2005-235497 A | 9/2005 |
| JP | 2007-80720 A | 3/2007 |
| JP | 2007-227967 A | 9/2007 |
| JP | 2007-281251 A | 10/2007 |
| JP | 2007-281252 A | 10/2007 |
| JP | 3998984 B2 | 10/2007 |
| JP | 2007-291396 A | 11/2007 |
| JP | 4012375 B2 | 11/2007 |
| JP | 2009-295862 A | 12/2009 |
| JP | 2010-80679 A | 4/2010 |
| JP | 2011-228495 A | 11/2011 |
| JP | 2013-38374 A | 2/2013 |
| JP | 2013-537723 A | 10/2013 |
| JP | 2014-45026 A | 3/2014 |
| JP | 2014-72205 A | 4/2014 |
| JP | 2014-127701 A | 7/2014 |
| JP | 2014-139963 A | 7/2014 |
| JP | 2014-236029 A | 12/2014 |
| JP | 2015-18675 A | 1/2015 |
| JP | 2015-70189 A | 4/2015 |
| JP | 2015-80800 A | 4/2015 |
| JP | 2015-95590 A | 5/2015 |
| JP | 2015-103586 A | 6/2015 |
| JP | 2016-18831 A | 2/2016 |
| JP | 2016-34030 A | 3/2016 |
| JP | 2016-111221 A | 6/2016 |
| JP | 2016-136615 A | 7/2016 |
| JP | 2016-213253 A | 12/2016 |
| JP | 2016-213466 A | 12/2016 |
| JP | 2016-225620 A | 12/2016 |
| JP | 2017-5174 A | 1/2017 |
| JP | 2017-41645 A | 2/2017 |
| JP | 2017-50315 A | 3/2017 |
| JP | 2017-510531 A | 4/2017 |
| JP | 6110437 B2 | 4/2017 |
| JP | 2017-112209 A | 6/2017 |
| JP | 2017-121648 A | 7/2017 |
| JP | 2018-120902 A | 8/2017 |
| JP | 2017-216398 A | 12/2017 |
| JP | 6273873 B2 | 2/2018 |
| JP | 2018-107256 A | 7/2018 |
| JP | 2018-107423 A | 7/2018 |
| JP | 2018-116951 A | 7/2018 |
| JP | 2018-160697 A | 10/2018 |
| JP | 2018-163901 A | 10/2018 |
| JP | 2018-163986 A | 10/2018 |
| JP | 2018-174189 A | 11/2018 |
| JP | 2018-174190 A | 11/2018 |
| JP | 2018-199605 A | 12/2018 |
| JP | 2019-16672 A | 1/2019 |
| KR | 10-1997-0050005 A | 7/1997 |

(56) References Cited

FOREIGN PATENT DOCUMENTS

| | | |
|---|---|---|
| KR | 10-0184043 B1 | 5/1999 |
| KR | 10-2001-0107033 A | 12/2001 |
| KR | 10-2002-0008574 A | 1/2002 |
| KR | 2002-0008574 A | 1/2002 |
| KR | 20-0266536 Y1 | 2/2002 |
| KR | 10-0447323 B1 | 9/2004 |
| KR | 10-0538733 B1 | 12/2005 |
| KR | 10-2006-0111449 A | 10/2006 |
| KR | 10-0687557 B1 | 2/2007 |
| KR | 10-0720090 B1 | 5/2007 |
| KR | 10-2007-0085553 A | 8/2007 |
| KR | 10-0794961 B1 | 1/2008 |
| KR | 10-2008-0047127 A | 5/2008 |
| KR | 10-0859206 B1 | 9/2008 |
| KR | 10-0870685 B1 | 11/2008 |
| KR | 10-2010-0044450 A | 4/2010 |
| KR | 10-2010-0097383 A | 9/2010 |
| KR | 10-2011-0112974 A | 10/2011 |
| KR | 10-2012-0023120 A | 3/2012 |
| KR | 10-2012-0051992 A | 5/2012 |
| KR | 10-1160120 B1 | 6/2012 |
| KR | 10-2013-0027159 A | 3/2013 |
| KR | 10-2013-0038825 A | 4/2013 |
| KR | 10-2014-0044746 A | 4/2014 |
| KR | 10-1466582 B1 | 11/2014 |
| KR | 10-1468680 B1 | 12/2014 |
| KR | 10-1486366 B1 | 1/2015 |
| KR | 10-2015-0014167 A | 2/2015 |
| KR | 10-1531097 B1 | 6/2015 |
| KR | 10-2015-0145697 A | 12/2015 |
| KR | 10-2016-0048868 A | 5/2016 |
| KR | 10-2016-0094502 A | 8/2016 |
| KR | 10-2016-0114710 A | 10/2016 |
| KR | 10-2016-0124323 A | 10/2016 |
| KR | 10-2016-0141516 A | 12/2016 |
| KR | 10-2017-0084562 A | 7/2017 |
| KR | 10-1760846 B1 | 7/2017 |
| KR | 10-2017-0126394 A | 11/2017 |
| KR | 10-1825149 B1 | 2/2018 |
| KR | 10-1825276 B1 | 2/2018 |
| KR | 10-2018-0040498 A | 4/2018 |
| KR | 10-2018-0067568 A | 6/2018 |
| KR | 10-2018-0088599 A | 8/2018 |
| KR | 10-2018-0116733 A | 10/2018 |
| KR | 10-1903485 B1 | 10/2018 |
| KR | 10-2019-0002622 A | 1/2019 |
| KR | 10-2019-0003050 A | 1/2019 |
| KR | 10-2019-0008103 A | 1/2019 |
| KR | 10-1944718 B1 | 2/2019 |
| KR | 10-2019-0026676 A | 3/2019 |
| TW | 201929100 A | 7/2019 |
| WO | WO 2004/053983 A1 | 6/2004 |
| WO | WO 2006/050205 A2 | 5/2006 |
| WO | WO 2008/013054 A1 | 1/2008 |
| WO | WO 2008/105496 A1 | 9/2008 |
| WO | WO 2009/005492 A1 | 1/2009 |
| WO | WO 2012/061304 A1 | 5/2012 |
| WO | WO 2015/198912 A1 | 12/2015 |
| WO | WO 2016/052221 A1 | 4/2016 |
| WO | WO 2017/057645 A1 | 4/2017 |
| WO | WO 2017/188281 A1 | 11/2017 |
| WO | WO 2018/101468 A1 | 6/2018 |

OTHER PUBLICATIONS

U.S. Appl. No. 17/434,906, filed Aug. 30, 2021, Kim et al., Absolics Inc.

U.S. Appl. No. 17/433,338, filed Aug. 24, 2021, Kim et al., Absolics Inc.

U.S. Appl. No. 17/433,349, filed Aug. 24, 2021, Kim et al., Absolics Inc.

* cited by examiner

[FIG. 1]
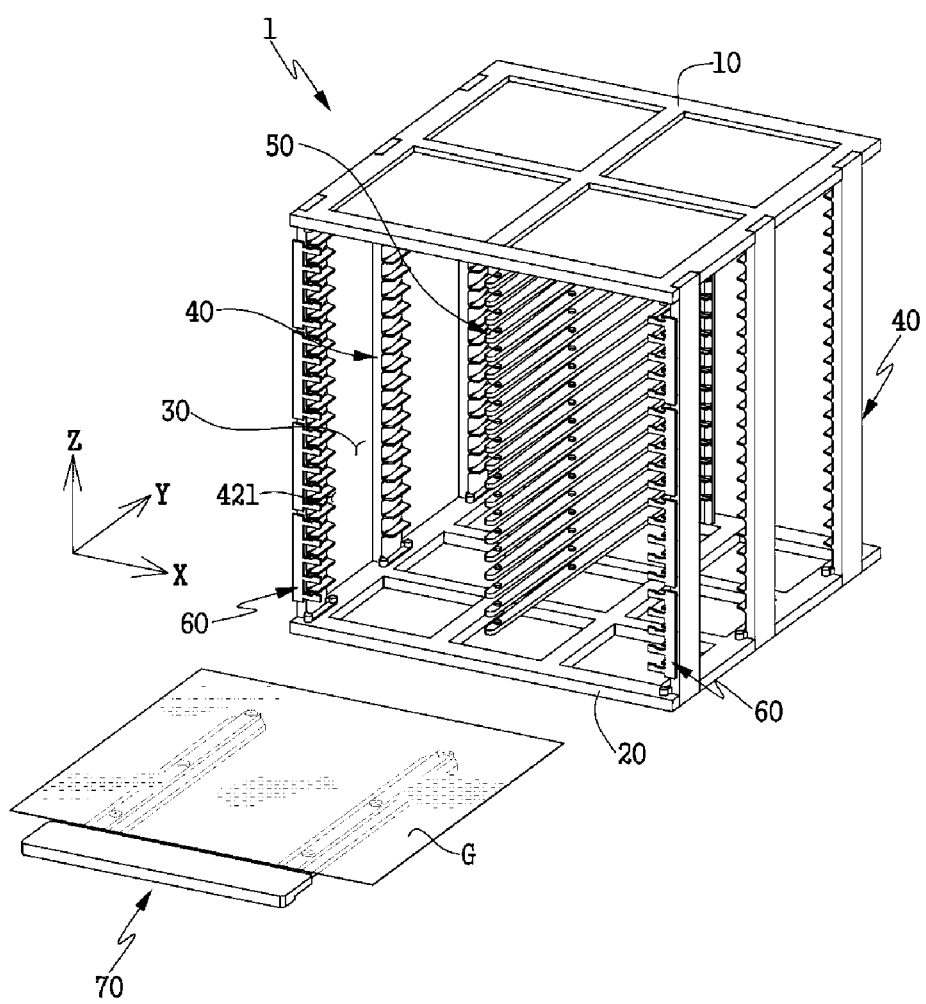

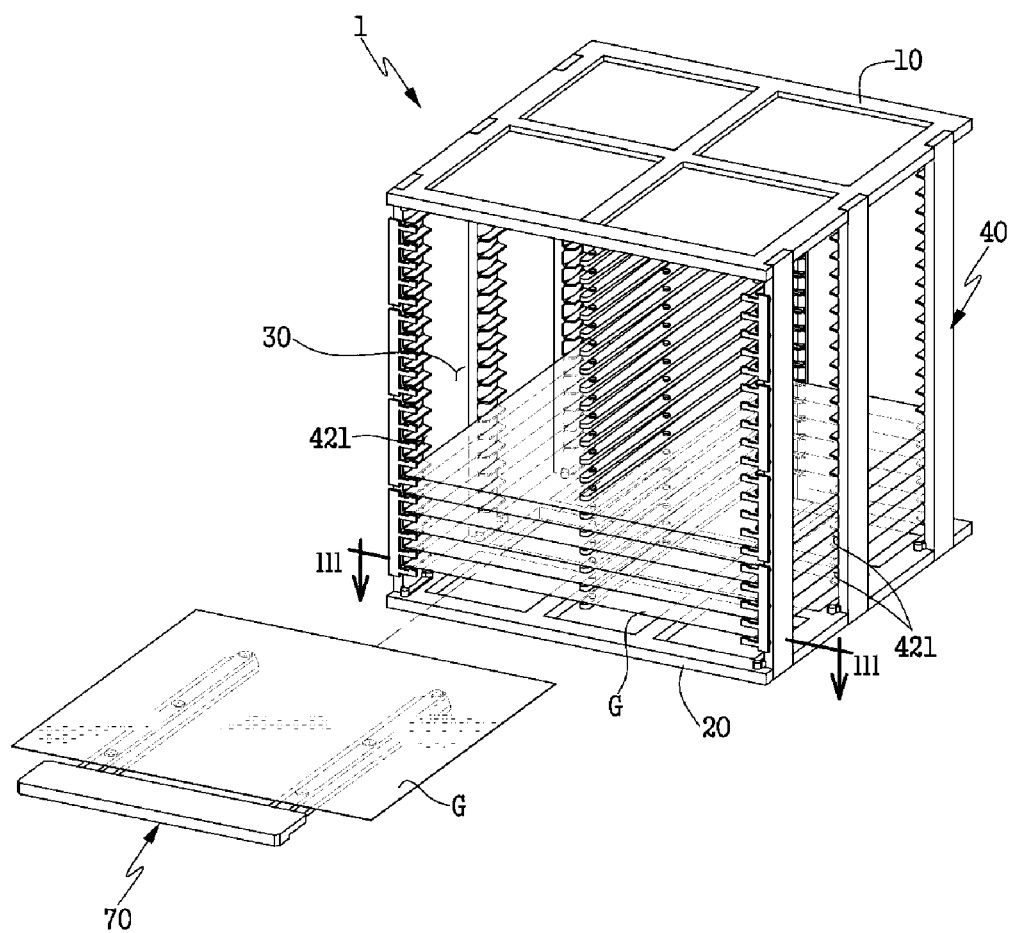
[FIG. 2]

[FIG. 3]
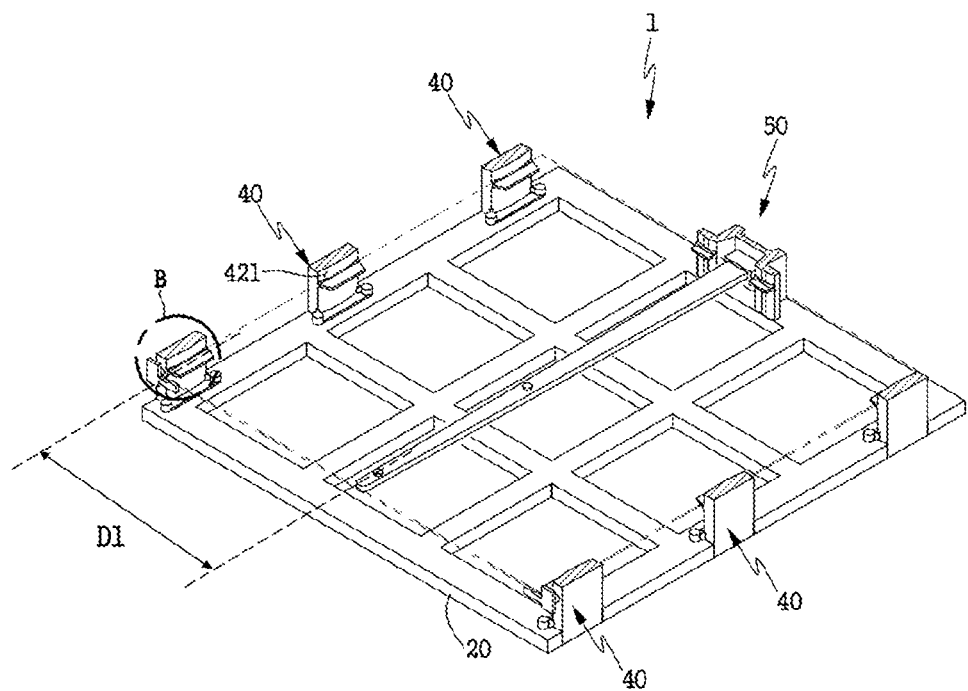

[FIG. 4]
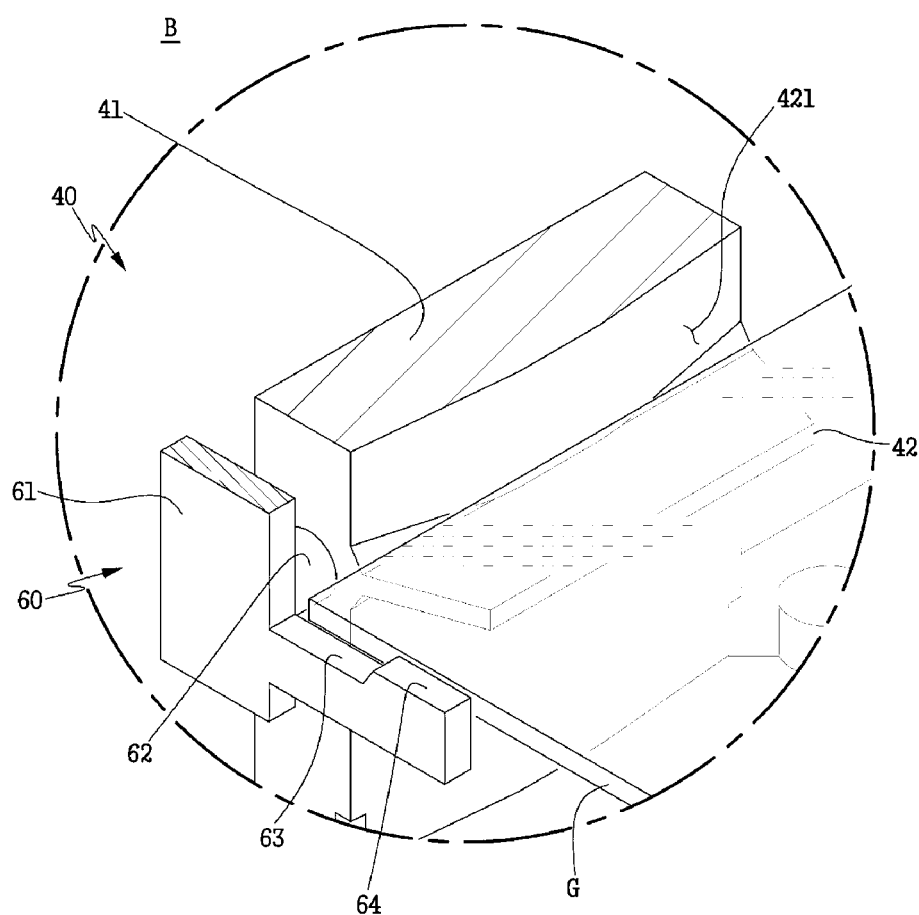

[FIG. 5]
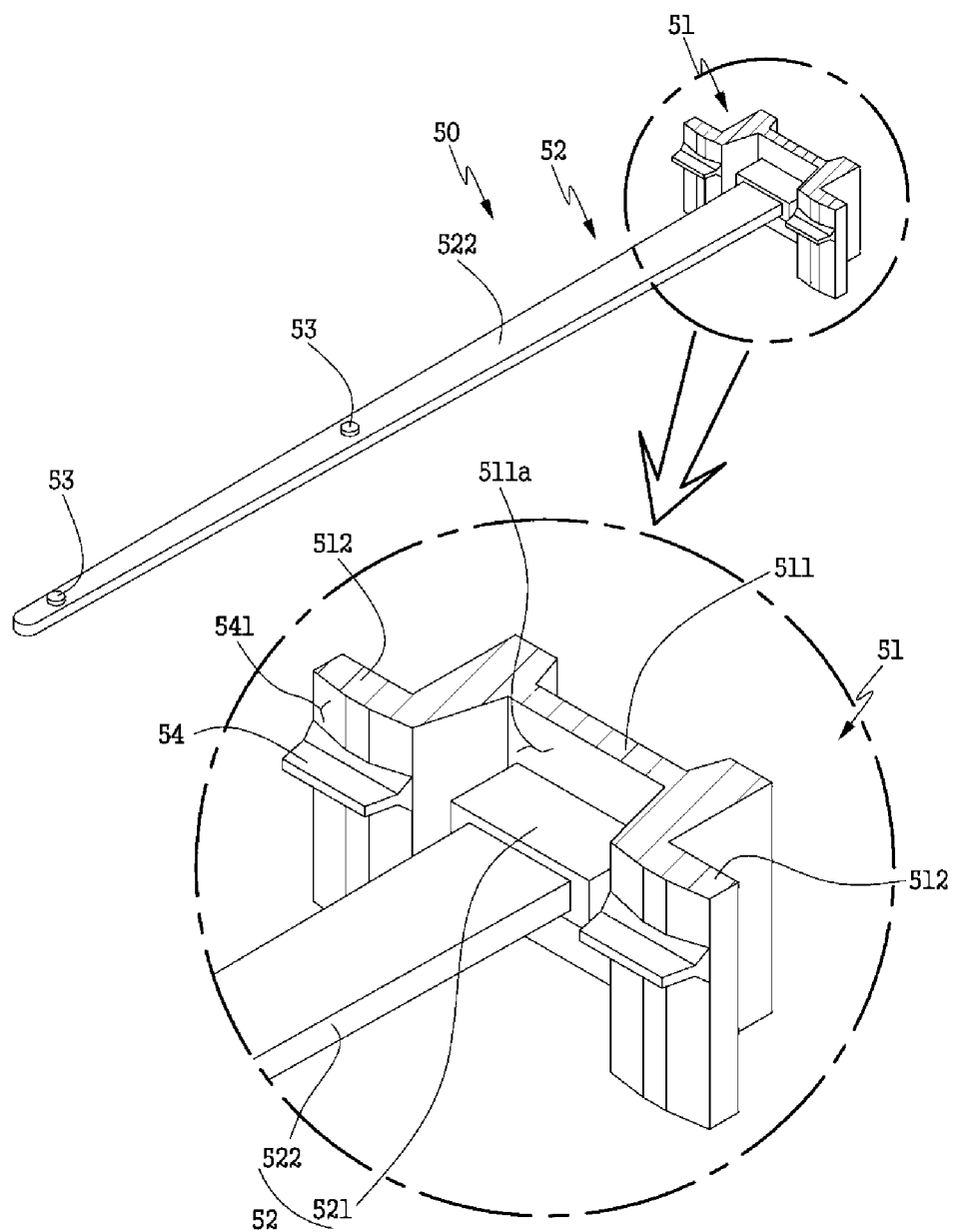

[FIG. 6]
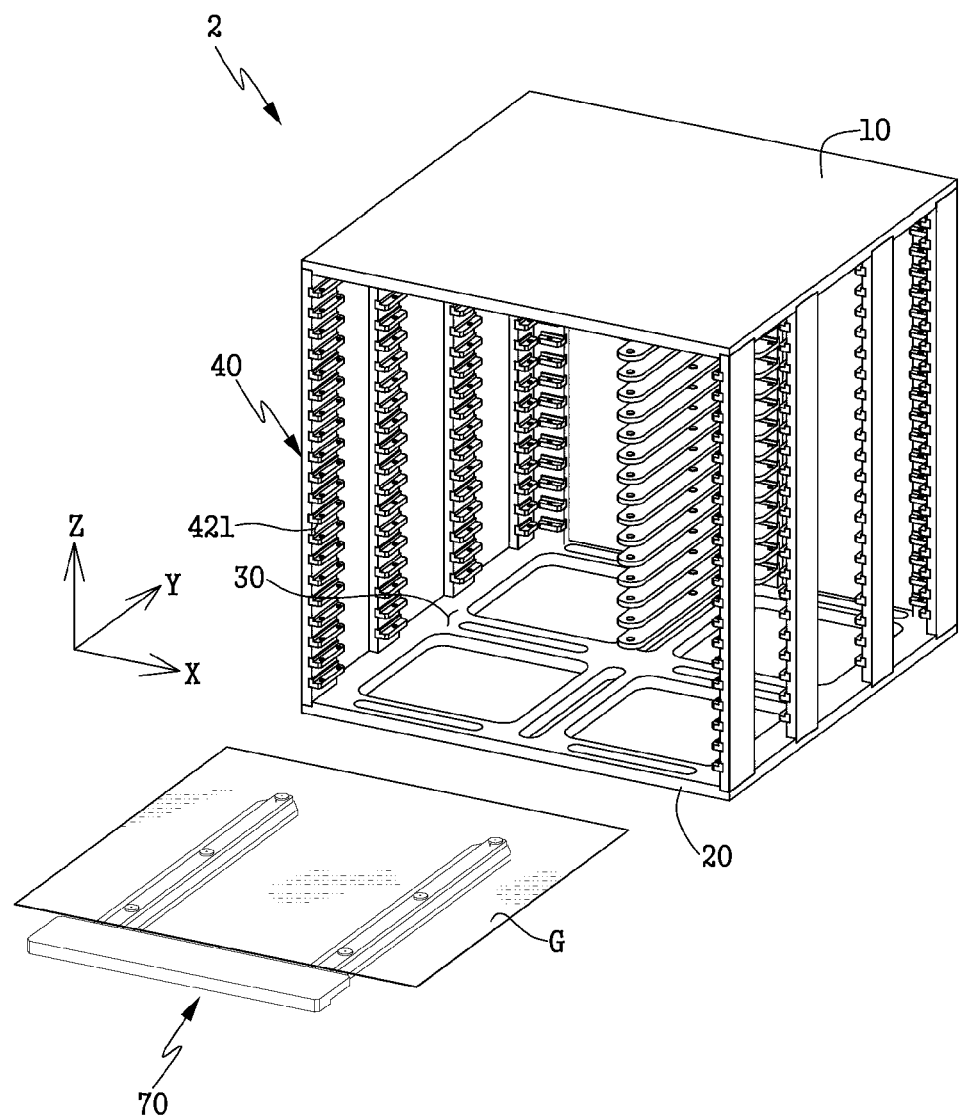

[FIG. 7]
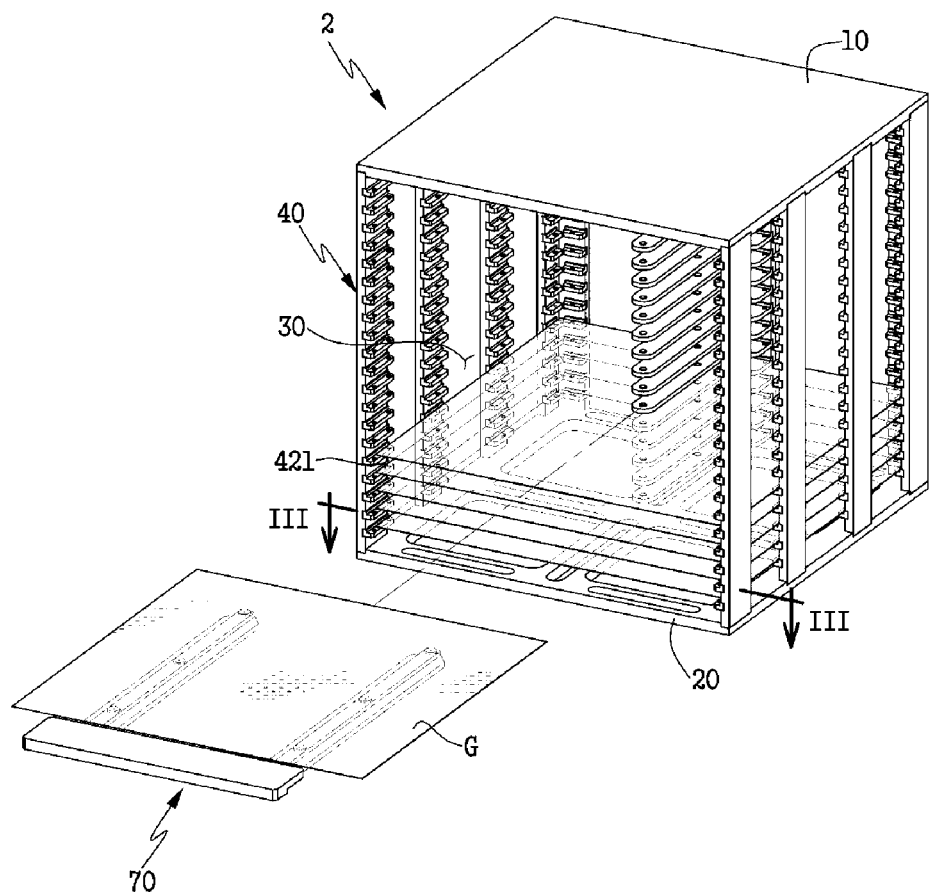

[FIG. 8]
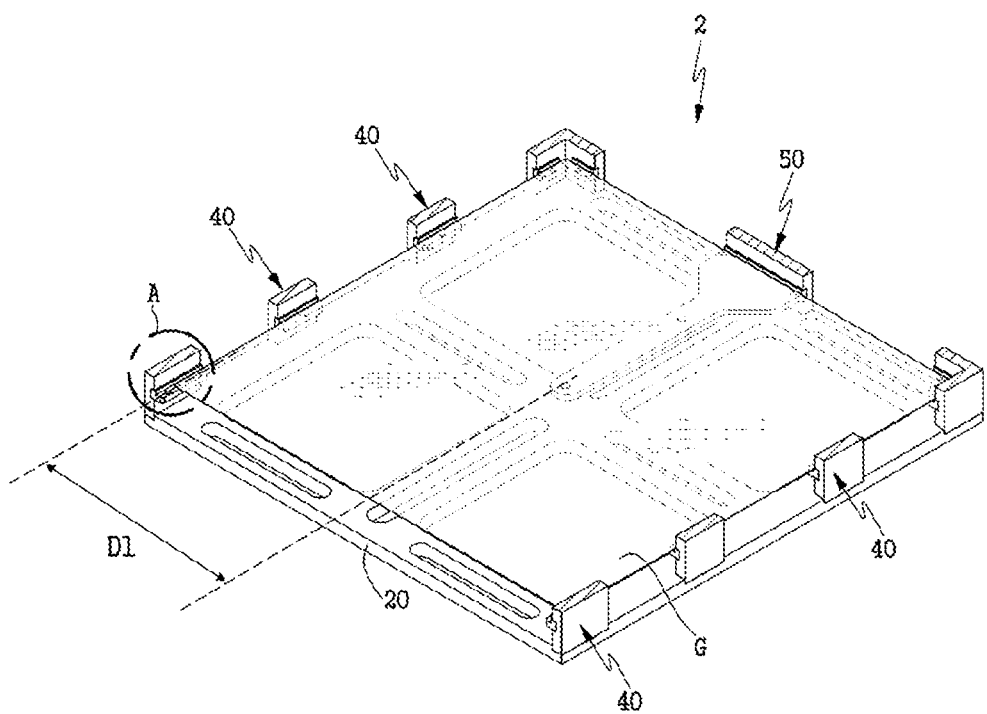

[FIG. 9]
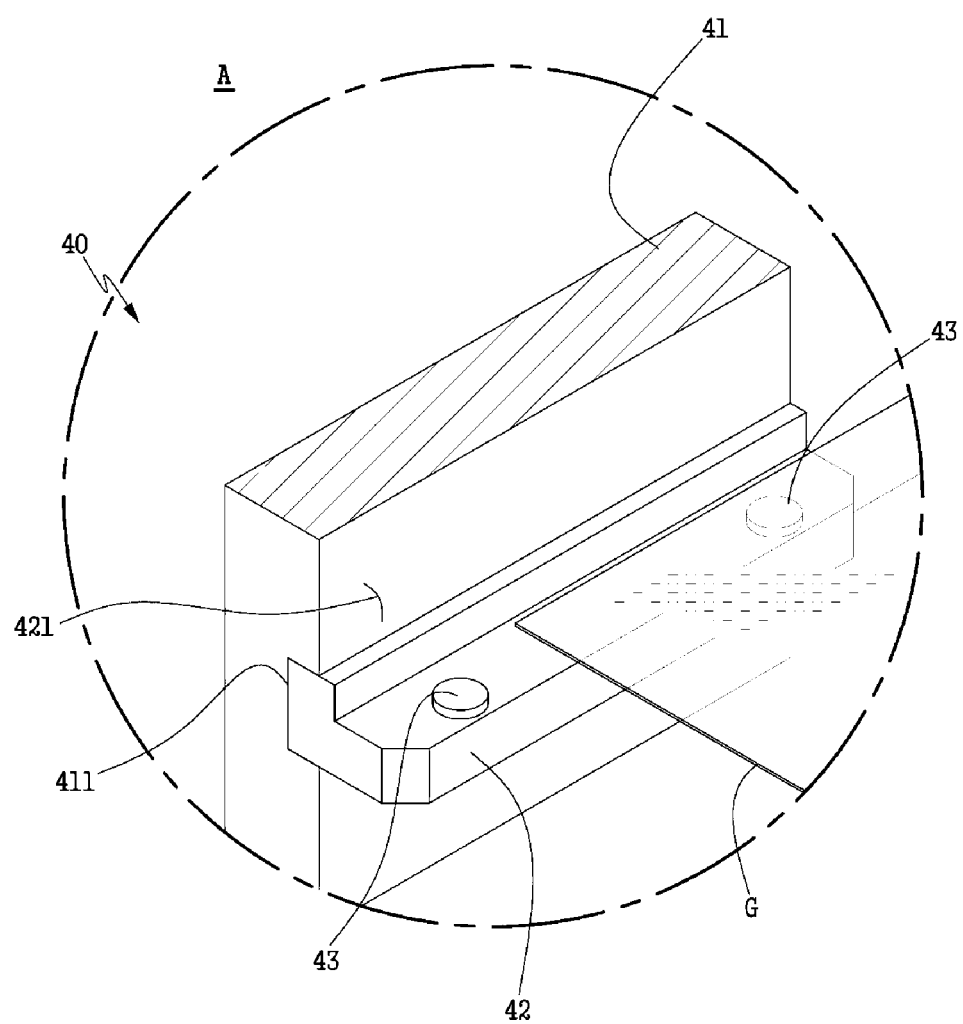

[FIG. 10]
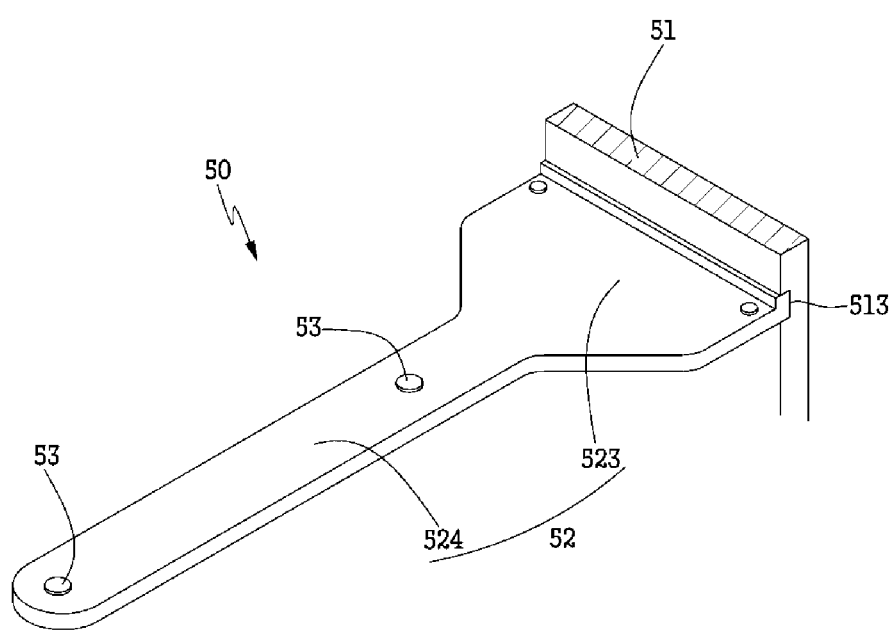

[FIG. 11]
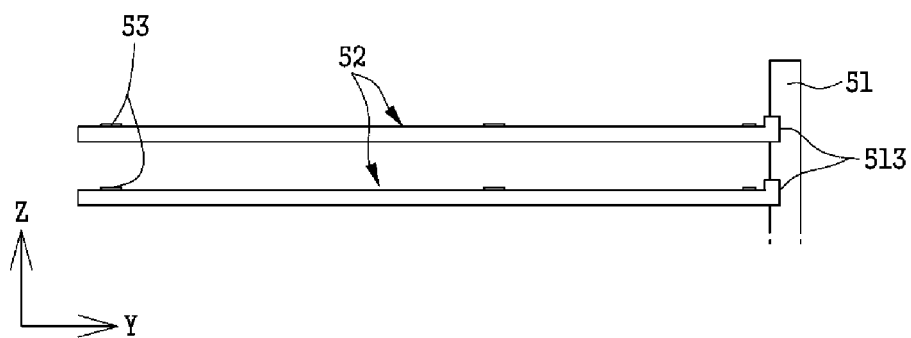

[FIG. 12]
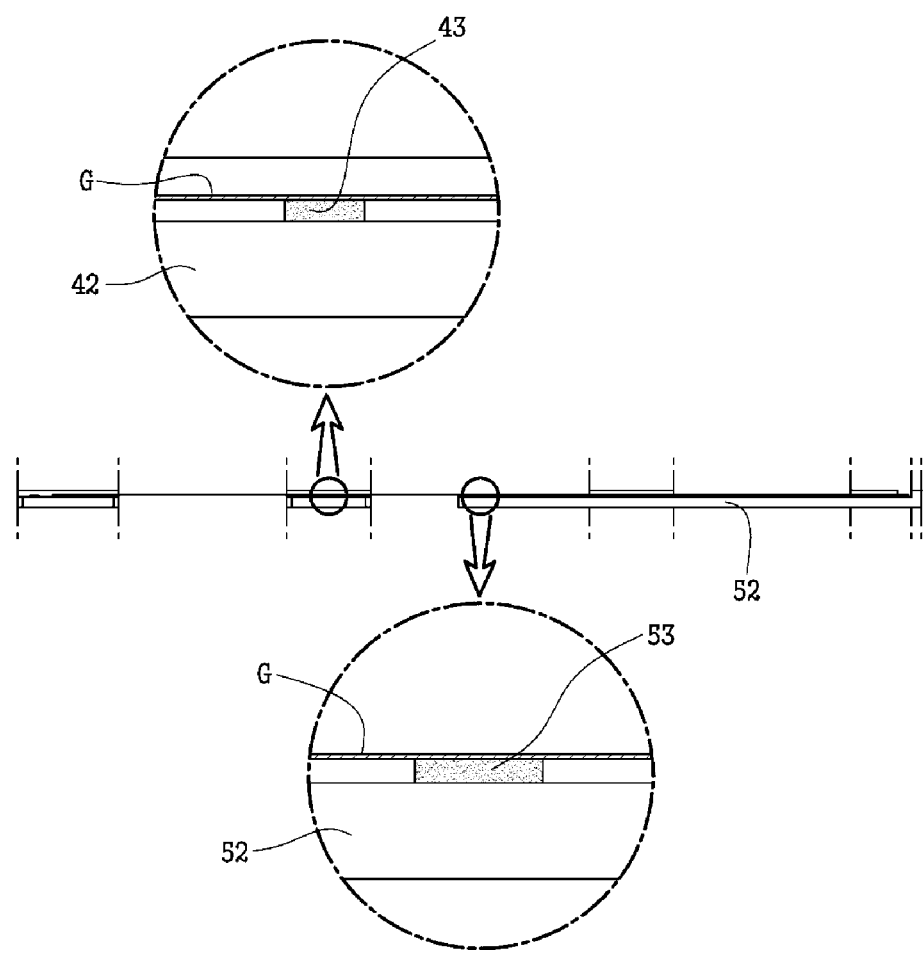

[FIG. 13]
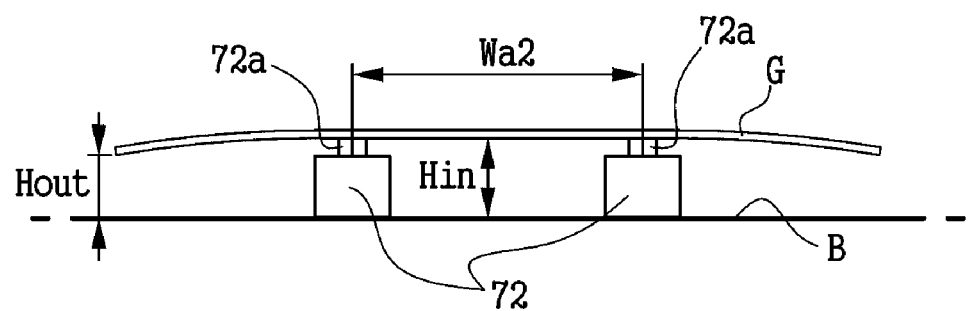

[FIG. 14A]
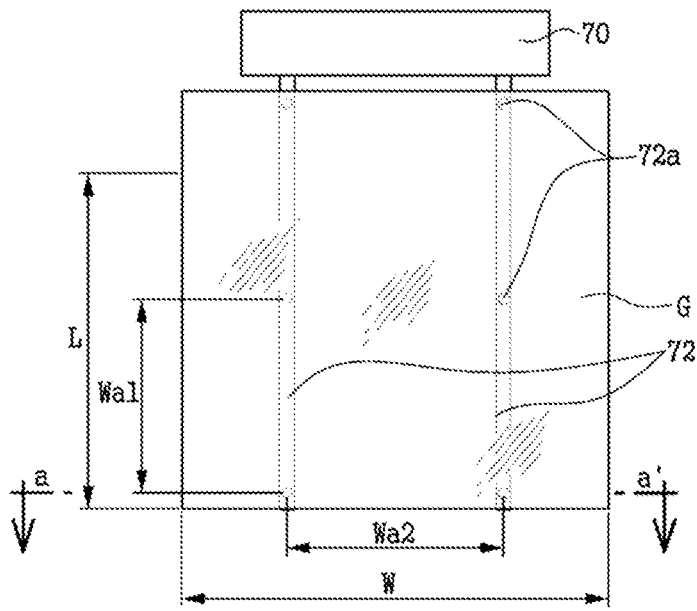
[FIG. 14B]
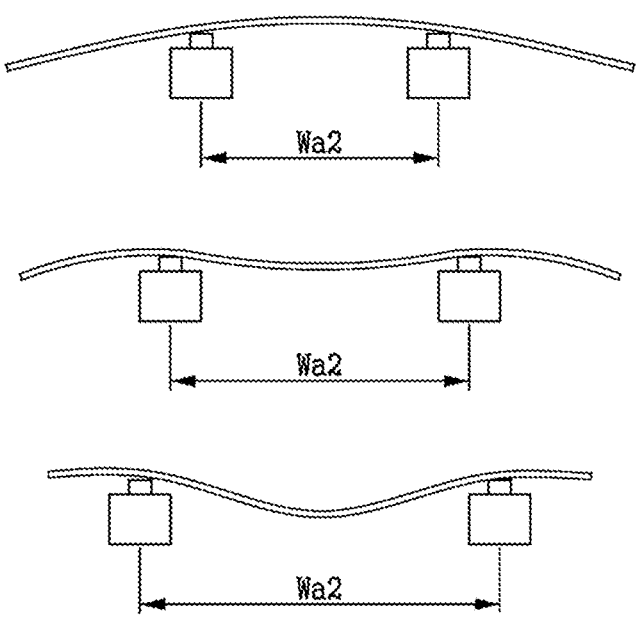

[FIG. 15]
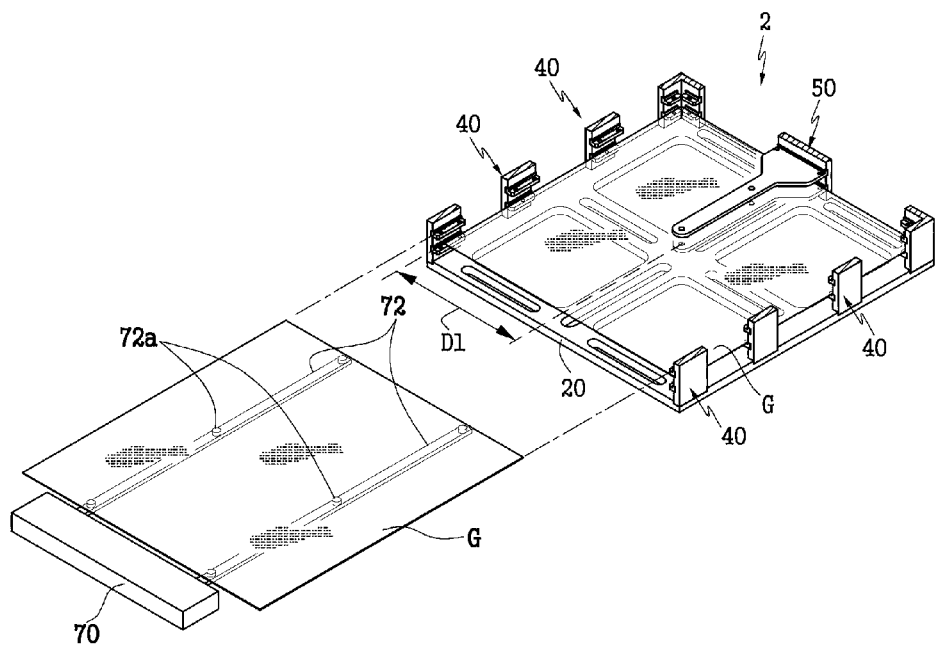

LOADING CASSETTE FOR SUBSTRATE INCLUDING GLASS AND SUBSTRATE LOADING METHOD TO WHICH SAME IS APPLIED

CROSS-REFERENCE TO RELATED APPLICATION

This application is a U.S. National Stage Application of International Application No. PCT/KR2020/003480, filed on Mar. 12, 2020 which has the benefit of priority to US Provisional Patent Application No. 62/816,984, filed on Mar. 12, 2019, U.S. Provisional Patent Application No. 62/816,995, filed on Mar. 12, 2019, U.S. Provisional Patent Application No. 62/826,105, filed on Mar. 29, 2019, U.S. Provisional Patent Application No. 62/826,122, filed on Mar. 29, 2019, and U.S. Provisional Patent Application No. 62/826,144, filed on Mar. 29, 2019, and all content of the basis application of the above priority is incorporated by the content of this application.

FIELD

An embodiment relates to a loading cassette of a substrate including glass and a method of loading a substrate applied with the same.

RELATED ART

A cassette is applied to transfer and store many substrates easily, accurately, and harmoniously. In general, a cassette allows many substrates to be loaded in up and down with space from each other in the inside of a frame whose one side surface is opened. And a method of withdrawing these loaded substrates for proceeding of work of the substrates and after that inserting the substrates processed by the work into a cassette again is carried out.

A glass substrate for semiconductor packaging is utilized for a high-end packaging substrate, and forms multiple vias in a thin glass substrate for utilizing as a packaging substrate. A glass substrate with a comparatively thin thickness may be fragile to vibration or impact due to its properties, and in a case of a glass substrate with a large area, a sag may occur in a high possibility inside a cassette due to own weight and this may accelerate damage of the glass substrate.

The background art described above is a technical information which has been kept by inventors for deriving example embodiments, or found in a process of deriving example embodiments, and is not necessarily a known art opened to general public before the present application.

RELATED ART DOCUMENTS

Patent Documents

Model Utility Right No. 20-0266536 (2002.02.19.)
Korean Patent Publication No. 10-2001-0107033 (2001.12.07.)

DISCLOSURE

Technical Problem

Objectives of an embodiment is to provide a loading cassette minimizing impact transmitted to a substrate including glass and particularly being suitable for loading and moving of a glass substrate with a large area, and a method of loading a substrate applied with the same.

Technical Solution

To achieve the above objectives, a loading cassette according to one embodiment includes an upper plate, a lower plate facing to the upper plate with an interval, a loading space between the upper plate and the lower plate and a target substrate being disposed in, an edge supporting unit for connecting the upper plate and the lower plate and supporting left and right edges of the target substrate, and a rear supporting unit for connecting the upper plate and the lower plate and supporting a rear edge of the target substrate, wherein the rear supporting unit includes a rear frame being connecting the upper plate and the lower plate in a rear surface and a middle supporting member being protruding to the front direction from the rear frame, the target substrate is a substrate including a glass substrate which includes or does not include a through hole, and the middle supporting member controls a maximum sag of the target substrate based on the edge supporting unit (as 0 mm) within 3 mm.

In one embodiment, when a thickness (mm) of the target substrate is expressed as GT, D1 is a distance (mm) between one side of the edge supporting member and the middle supporting unit and the D1 may satisfy below Condition (1) or Condition (2);

When $0.1 < GT \leq 0.5, 150 \leq D1 \leq 275$   Condition (1):

When $0.5 < GT \leq 1.5, 220 \leq D1 \leq 330$.   Condition (2):

In one embodiment, the middle supporting member may include a middle supporting bar, wherein the middle bearing member is disposed at one part of the middle supporting member and the rear frame is near to other part of the middle supporting member, the middle bearing member may be disposed to have gradient to be higher than the other part.

In one embodiment, the edge supporting unit may include a side frame being connecting the upper plate and the lower plate in both left and right sides respectively, and an edge supporting member forming a side slot disposed in the rear frame to support the left and right edges of the target substrate and not allowing the target substrate to contact the side frame, the side slot may be formed in plurality along an up-and-down direction of the side frame with having intervals.

In one embodiment, the middle supporting member may include a connecting block combined with the rear frame, and a middle supporting bar being protruding to the front from the connecting block, wherein the left-and-right width of the middle supporting bar is narrower as being distant from the connecting block, wherein the middle bearing member may be disposed in the middle supporting bar in a number of one, two, or more.

In one embodiment, a length of the middle supporting bar may be ⅓ to ⅔ of the back-and-forth length of the loading space.

In one embodiment, the rear supporting unit may include a rear frame being connecting the upper plate and the lower plate at the rear surface and having rear inserting slots formed in a left-and-right direction, a middle supporting member being protruding to the front direction from the rear frame and being combined with the rear inserting slots and having a first area portion and a second area portion, and a middle bearing member being protruding from the upper surface of the middle supporting member and directly connecting the target substrate to control sag of the target substrate, wherein the first area portion may be connected to the rear frame and the area of the second area portion may be narrower than the area of the first area portion.

To achieve the above objectives, a method of loading a target substrate according to one embodiment includes an entering step for carrying in a target substrate to a loading space of a loading cassette;

a supporting step for moving the entire target substrate by fixing at a loading carrier to the loading space with left and right edges of the target substrate placed on an edge supporting unit of the loading cassette according to claim 1 and controlling a maximum sag of the target substrate to be within 3 mm based on the edge supporting unit (as 0 mm) by supporting the target substrate with a middle supporting member in at least one point or more of the middle; and a completing step for releasing the fixation of the loading carrier and the target substrate, wherein the target substrate includes a glass substrate with or without a through hole, and when the thickness (mm) of the target substrate is expressed as GT, D1 which is a distance (mm) between one side of the edge supporting member and the middle supporting member may satisfy below Condition (1) or Condition (2);

When $0.1 < GT \leq 0.5, 150 \leq D1 \leq 275$   Condition (1):

When $0.5 < GT \leq 1.5, 220 \leq D1 \leq 330$.   Condition (2):

To achieve the above objectives, a method of loading a target substrate according to other embodiment includes a carry-in step for allowing the entire target substrate to enter and be disposed inside a loading space, in which the target substrate is polygonal having L as the length (mm) and W as the width (mm) is carried in the loading space of a cassette, by applying a loading carrier having two or more hands with maintaining variation (D) indicated by below Formula (1) within −15 to +10 mm;

a support step for controlling a maximum sag of the target substrate to be within 3 mm based on the edge supporting unit (as 0 mm) by supporting the target substrate with a middle supporting member in at least one point or more of the middle; and a completion step of releasing the fixation of the loading carrier and the target substrate and then taking out the loading carrier to the external of the loading cassette, wherein the target substrate is a glass substrate having many through holes or a substrate for semiconductor packaging in which an electrical conductive pattern and an insulating layer are laminated to the glass substrate, and when a thickness (mm) of the target substrate is GT, the hands have one or more hand forks respectively and Wa2 (mm) is the shortest interval between hand forks placed on different hands; and below Condition (1) or Condition (2) may be satisfied;

Variation (D)=Inside Height of Target Substrate
  (Hin,mm)−Outside Height of Target Substrate
  (Hout,mm)   Equation (1):

When $0.1 < GT \leq 0.5, (W/3.4) \leq Wa2 \leq (W/1.8)$   Condition (1):

When $0.5 < GT \leq 1.5, (W/2.3) \leq Wa2 \leq (W/1.6)$.   Condition (2):

In one embodiment, when the thickness (mm) of the target substrate is GT, Dh (mm) which is an interval between the edge supporting units neighboring to each other in up and down may satisfy below Formula (2);

EFFECTS

According to example embodiments of present application, a cassette which can load a target substrate without occurring a sag of a target substrate and a problem of damage in a substrate due to the sag can be provided, as minimizing damage which can occur during loading, moving, and carrying out of glass even though the target substrate including a glass substrate of a large area with or without a through hole. In addition, a target substrate placed in a loading space can stably keep a loaded state through being supported by an edge supporting unit and a rear supporting unit, and can be protected from impact which can occur during loading, impact added from the external, and the like.

BRIEF DESCRIPTION OF THE DRAWINGS

FIG. 1 is a perspective view for showing a loading cassette according to an embodiment of the present application;

FIG. 2 is a schematic view for showing a state of a glass substrate loaded in a loading cassette of FIG. 1;

FIG. 3 is a cross sectional view cut along a III-III line from FIG. 2;

FIG. 4 is an enlarged view of A portion of FIG. 3;

FIG. 5 is an enlarged view of a center supporting unit of FIG. 3;

FIG. 6 is a perspective view for showing a loading cassette according to one embodiment of the present application;

FIG. 7 is a schematic view for showing a glass substrate loaded in a loading cassette of FIG. 6;

FIG. 8 is a cross sectional view cut along a VI-VI line from FIG. 7;

FIG. 9 is an enlarged view of A portion of FIG. 8;

FIG. 10 is an enlarged view of a center supporting unit of FIG. 8;

FIG. 11 is a side view for showing a center supporting unit of FIG. 10; and

FIG. 12 is a schematic view for showing a state of a center supporting unit of FIG. 11 supporting a glass substrate.

FIG. 13 is a conceptual view for illustrating a fork test conducted in the present application;

FIGS. 14A and 14B are conceptual views for illustrating a loading carrier and a target substrate of the present application, and a sag observed at a-a', respectively;

FIG. 15 is a conceptual view for illustrating a process for a target substrate placed on a loading carrier to be inserted into a loading space;

DETAILED DESCRIPTION OF EXEMPLARY EMBODIMENTS

Hereinafter, exemplary embodiments of the present disclosure will be described in detail with reference to the accompanying drawings so that they can be easily practiced by those skilled in the art to which the present disclosure pertains. The embodiments may, however, be embodied in many different forms and is not to be construed as being limited to the embodiments set forth herein. Same reference numerals are designated to similar elements throughout the specification.

Throughout the present specification, the phrase "combination(s) thereof" included in a Markush-type expression denotes one or more mixtures or combinations selected from the group consisting of components stated in the Markush-type expression, that is, denotes that one or more components selected from the group consisting of the components are included.

Throughout the present specification, terms such as "first," "second," "A," or "B" are used to distinguish the same terms from each other. The singular forms "a," "an," and "the" include the plural form unless the context clearly dictates otherwise.

In the present specification, the term "X-based" may mean that a compound includes a compound corresponding to X or a derivative of X.

In the present specification, "B being disposed on A" means that B is disposed in direct contact with A or disposed over A with another layer interposed therebetween and thus should not be interpreted as being limited to B being disposed in direct contact with A.

In the present specification, "B being connected to A" means that B is connected to A directly or through another element therebetween, and thus should not be interpreted as being limited to B being directly connected to A, unless otherwise noted.

In the present specification, a singular form is contextually interpreted as including a plural form as well as a singular form unless specially stated otherwise.

In this application, sag is evaluated for a position of a sagged portion from the reference position by mm unit, and expressed in a positive number.

Loading Cassette 1

A loading cassette according to one embodiment will be described with reference to FIGS. 1 to 5.

FIG. 1 is a perspective view for showing a loading cassette according to an embodiment of the present application, FIG. 2 is a schematic view for showing a state of a glass substrate loaded in a loading cassette of FIG. 1, FIG. 3 is a cross sectional view cut along a III-III line from FIG. 2, FIG. 4 is an enlarged view of A portion of FIG. 3, and FIG. 5 is an enlarged view of a center supporting unit of FIG. 3.

With reference to FIGS. 1 to 5, a loading cassette 1 according to the present embodiment supports a loaded target substrate G and the like, and comprises an upper plate 10, a lower plate 20, an edge supporting unit 40, and a rear supporting unit 50.

The loading cassette 1 may further comprise a front stopper 60.

The upper plate 10 and the lower plate 20 have a predetermined area and are apart from each other in an up-and-down direction. The lower plate 20 may be formed by many frames connected in breadth and length directions.

The upper plate 10 and the lower plate 20 have an interval maintained by an edge supporting unit 40 and a rear supporting unit 50. And, among them, a loading space 30 where a target substrate G is loaded is formed. Here, a loading capacity of the loading space 30 may be changed depending on the sizes of the upper plate 10 and the lower plate 20; and the up-and-down direction lengths of the edge supporting unit 40 and the rear supporting unit 50. The loading capacity, in particularly the sizes of the upper plate 10 and the lower plate 20 may be changed depending on the standard of the target substrate G.

The target substrate G may be a substrate with a large area, and may be a glass substrate whose thickness is 1 mm or less, or a substrate in which an insulating layer and/or an electrical conductive layer are formed on the glass substrate (or glass substrate having through vias).

The target substrate G may substantially have a quadrangle plate form whose one side is 400 mm or more, but its shape is not limited to a quadrangle plate form.

A target substrate G may have a first surface and a second surface facing each other.

A target substrate G may have a plurality a core via penetrating through the first surface and the second surface.

The core via may include a first opening part in contact with the first surface; a second opening part in contact with the second surface; and a minimum inner diameter part having the smallest inner diameter in the entire core via from the first opening part to the second opening part.

An average diameter of the minimum inner diameter part may be 50 μm to 95 μm.

The minimum inner diameter and satisfies the condition of Equation 1 below.

$$0.83 \times D_{90} \leq D_{50} \leq 1.25 \times D_{10} \quad \text{[Equation 1]}$$

In the Equation 1, $D_{50}$ is a value corresponding to 50% in the diameter distribution of the minimum inner diameter, $D_{90}$ is a value corresponding to 90% in the diameter distribution of the minimum inner diameter, and $D_{10}$ is a value corresponding to 10% in the diameter distribution of the minimum inner diameter.

An average diameter of the minimum inner diameter may be 55 μm to 85 μm, or 60 μm to 70 μm.

In further detail, the minimum inner part may satisfy the condition of Equation 1-1 below.

$$0.83 \times D_{90} \leq D_{50} \leq 1.25 \times D_{10} \quad \text{[Equation 1-1]}$$

In the Equation 1-1, $D_{50}$ is a value corresponding to 50% in the diameter distribution of the minimum inner part, $D_{90}$ is a value corresponding to 90% in the diameter distribution of the minimum inner part, and $D_{10}$ is a value corresponding to 10% in the diameter distribution of the minimum inner part.

In detail, a target opening part which is a larger one between the first surface opening part diameter and the second surface opening part diameter, may have an average diameter of 70 μm to 120 μm.

In detail, a target opening part which is a larger one between the first surface opening part diameter and the second surface opening part diameter may satisfy the condition of Equation 2 below.

$$0.9 \times D_{90} \leq D_{50} \leq 1.1 \times D_{10} \quad \text{[Equation 2]}$$

In the Equation 2, $D_{50}$ is a value corresponding to 50% in the diameter distribution of a target opening part, $D_{90}$ is a value corresponding to 90% in the diameter distribution of a target opening part, and $D_{10}$ is a value corresponding to 10% in the diameter distribution of a target opening part.

In detail, a target opening part which is a larger one between the first surface opening part diameter and the second surface opening part diameter, may have an average diameter of 80 μm to 105 μm.

In detail, a target opening part which is a larger one between the first surface opening part diameter and the second surface opening part diameter may satisfy the condition of Equation 2-1 below.

$$0.92 \times D_{90} \leq D_{50} \leq 1.08 \times D_{10} \quad \text{[Equation 2-1]}$$

In the Equation 2, $D_{50}$ is a value corresponding to 50% in the diameter distribution of a target opening part, $D_{90}$ is a value corresponding to 90% in the diameter distribution of a target opening part, and $D_{10}$ is a value corresponding to 10% in the diameter distribution of a target opening part.

In the core via, an average diameter of a target opening part which is a larger one between the first surface opening part diameter—which is a diameter at an opening part in contact with the first surface—and the second surface opening part diameter—which is a diameter at an opening part in contact with the second surface—may have a larger value than $D_{50}$, which is a value corresponding to 50% in the diameter distribution of a target opening part.

The diameter distribution described above, is evaluated based on a diameter which is observed and measured by microscope in the cross-section, after dividing prepared samples into 9 compartments (3×3), and processing of cutting the samples of 5 areas (top left, bottom left, center, top right, bottom right).

A loading cassette 1 according to an embodiment may load stably a target substrate which has a core via with the above-described diameter distribution and diameter.

In addition, the point at which the minimum inner diameter part is located, when the entire length of the core via is 100%, may be a point of 40% to 60% from the first opening part, and may be a point of 45% to 55%. When the minimum inner diameter part is at the position described above, based on the entire length of core via, the design of electrically conductive layer of packaging substrate and the process of forming electrically conductive layer may be easier. And a loading cassette according to an embodiment can load this fragile target substrate stably.

The core via may be disposed in the number of 100 to 3000, or 100 to 2500, or 225 to 1024 based on a unit area (1 cm×1 cm) of the target substrate. The core via may be disposed at the target substrate in a pitch of 1.2 mm or less, may be disposed in a pitch of 0.12 to 1.2 mm, may be disposed in a pitch of 0.3 to 0.9 mm.

When the core via satisfies the above pitch condition, the formation of an electric conductive layer, etc., and the performance of a packaging substrate can be improved. And a loading cassette according to an embodiment can load this fragile target substrate stably.

The target substrate G may be a stress-controlled glass substrate.

The target substrate G may have a stress difference value (P) according to the below Formula (1) of 1.5 MPa or less; between a stress measured at a plain line which is a line linking places where the core via is not formed, and a stress measured at a via line which is a line linking places where the core via is formed.

$$P = Vp - Np \qquad \text{Formula (1)}$$

In the Formula (1), the P is a stress difference value measured at the same glass substrate, the Vp is a difference between the maximum value and the minimum value of stress measured at a via line, and the Np is a difference between the maximum value and the minimum value of stress measured at a plain line.

The P value may be 1.35 MPa or less, 1.2 MPa or less, or 1.1 MPa or less. Also, the P value may be 0.01 MPa or more, or 0.1 MPa or more.

As a glass substrate in which core vias having a stress difference value (P) in these ranges are formed is applied as a substrate for semiconductor packaging, it is possible to manufacture a packaging substrate having more stable mechanical properties, and a loading cassette according to an embodiment can load this fragile target substrate stably.

The Vp value may be 2.5 MPa or less, or 2.3 MPa or less, and the Vp value may be 2.0 MPa or less, or 1.8 MPa or less. Also, the Vp value may be 0.2 MPa or more, or 0.4 MPa or more.

When a difference (Vp) between the maximum value and the minimum value of stress measured at a via line is in these ranges, and a glass substrate where core vias are formed is applied as a substrate for semiconductor packaging, it is possible to manufacture a packaging substrate having more stable mechanical properties. And a loading cassette according to an embodiment can load this fragile target substrate stably.

The Np value may be 1.0 MPa or less, 0.9 MPa or less, or 0.8 MPa or less. Also, the Np value may be 0.1 MPa or more, or 0.2 MPa or more.

When a difference (Np) between the maximum value and the minimum value of stress measured at a plain line is in these ranges, and a glass substrate where core vias are formed is applied as a substrate for semiconductor packaging, it is possible to manufacture a packaging substrate having more stable mechanical properties. And a loading cassette according to an embodiment can load this fragile target substrate stably.

The glass substrate may satisfy a condition that a stress difference ratio (K) according to below Formula (2) is 6 or less.

$$K = Lp/La \qquad \text{Formula (2):}$$

In the Formula (2), the K is stress difference ratio measured at the same plane of the same glass substrate, the Lp is a difference of the maximum value and the minimum value of stress measured at a target line, and the La is an average value of stress measured at the target line, wherein the target line is selected one from a plain line which is a line linking places where a core via is not formed and a via line which is a line linking places where a core via is formed.

In detail, the K value may be 5 or less, 4.5 or less, or 4 or less. When the K value is in this range, and a target substrate where core vias are formed is applied as a substrate for semiconductor packaging, it is possible to manufacture a packaging substrate having more stable mechanical properties. And a loading cassette according to an embodiment can load this fragile target substrate stably.

The stress difference ratio (K) which is measured at the plain line may have a value of 2 or less. In detail, the stress difference ratio (Kn) of a plain line may be 1.8 or less, more than 0.3, or more than 0.5.

The stress difference ratio (K) which is measured at the via line may have a value of 6 or less, or 5 or less. The stress difference ratio (Kv) of a via line may be 4.5 or less, or 3 or less. Also, the stress difference ratio of a via line may be 0.5 or more, 1.0 or more, or 1.5 or more.

When the stress difference ratio (K) is in these ranges, and a target substrate where core vias are formed is applied as a substrate for semiconductor packaging, it is possible to manufacture a packaging substrate having more stable mechanical properties. And a loading cassette according to an embodiment can load this fragile target substrate stably.

The stress is analyzed by applying a birefringence 2D evaluation device. In detail, the birefringence 2D dispersion evaluation device may be WPA-200 device of NPM (NIPPON PULSE KOREA CO., LTD). In detail, when data are read on a glass substrate along to a stress measuring route by a probe, measured values such as a birefringence value are inputted by the device, and stress at a measuring route is presented by pressure unit (ex. MPa) through a predetermined calculation process. In this time, stress can be measured by inputting a stress-optical coefficient and a thickness of a measuring target, and 2.4 is applied as the stress-optical coefficient in the present disclosure.

The edge supporting units 40 are arranged in a back-and-forth direction (Y) at both left and right sides of the upper plate 10 and the lower plate 20, and connect the upper plate 10 and the lower plate 20. And the edge supporting units 40 support the edges of both left and right sides of the target substrate G.

The edge supporting unit 40 may comprise a buffer covering layer placed in at least a part of its surface.

The rear supporting unit 50 connects the upper plate 10 and the lower plate 20 by being disposed at the rear of the upper plate 10 and the lower plate 20.

The rear supporting unit 50 is disposed with having a certain distance with the center of the rear or the edge supporting unit 40, and thereby controls the target substrate G loaded in the loading space 30 not to be sagged by its own weight. In detail, the rear supporting unit 50 supports at least a part of the target substrate G and thereby prevents the target substrate G overall from sagging.

The front stopper 60 blocks the target substrate G loaded in the loading space 30 not to fall off to the external of the loading space 30 at the front of the loading space 30.

The front stopper 60 may comprise a buffer covering layer placed in at least a part of its surface.

The target substrate G of the loading space 30 can maintain a stable loaded state by the edge supporting unit 40 and the rear supporting unit 50. And the target substrate G of the loading space can be protected stably from impact which may occur during loading, impact added from external, and the like. Accordingly, damage of the target substrate G which may occur during loading and moving of the target substrate could be minimized.

The edge supporting unit 40 comprises a side frame 41, and an edge supporting member 42.

The side frame 41 has a predetermined length, its upper side is combined with a side surface of the upper plate 10 and its lower side is combined with a side surface of the lower plate 20.

The side frame 41 is combined with a fastening means (not shown) like a bolt.

The side frame 41 may be formed with aluminum coated or not coated by a protecting layer or the like. A material of the side frame 41 is not limited to aluminum.

The edge supporting member 42 is connected to the side frame 41.

The edge supporting members 42 are arranged along an up-and-down direction (Z) of the side frame 41 with intervals. Accordingly, a side slot 421 is formed between the edge supporting members 42 neighboring to each other. A target substrate G inserted to the side slot 421 is placed in an upper surface of the edge supporting member 42. On the other hand, neighboring edge supporting members 42 are connected from each other and their sides are not allowed to contact the side frame 41 when the target substrate G is loaded. And the edge supporting member 42 may comprise a buffer covering layer in at least a part of the surface thereof.

The rear supporting unit 50 may comprise a rear frame 51, a middle supporting member 52, a middle bearing member 53 and a rear stopper 54.

The rear frame 51 has a predetermined length, its upper side is combined with the rear surface of the upper plate 10 and its lower side is combined with the rear surface of the lower plate 20.

The rear frame 51 is also combined through a fastening means and may be formed with aluminum coated or not coated by a protecting layer or the like.

The rear frame 51 may comprise a rear main bar 511 in which holding slots where the connecting blocks are placed are formed along an up-and-down length direction, and a stopper combining bar 512 which is extended from both sides of the rear main bar to both left and right sides and combined with the rear stopper.

The rear main bar 511 may comprise a holding slot 511a connected to a loading space 30. The holding slot 511a may be formed along an up-and-down length direction (Z) of the rear main bar 511, and the area of the holding slot 511a may become wider in a direction from the inner surface to the opened front.

The stopper combining bar 512 is extended in a left-and-right direction (X) from both sides of the rear main bar 511 and has a preset area.

The stopper combining bar 512 has a plane.

The stopper combining bar 512 is composed in one body with the rear main bar 511 and made with aluminum or the like which is coated or not coated.

The middle supporting member 52 may comprise a connecting block 521 and a middle supporting bar 522.

The connecting block 521 is placed in a holding slot 511a and fixed with a fastening means (not shown).

The connecting block 521 may be not dislocated from the holding slot 511a. That is, the connecting block 512 may be placed inside the connecting block 521.

The middle supporting bar 522 has a preset length, is connected to the rear main bar 511 by the connecting block 521, and protrudes from the connecting block 521 to the front.

The length of the middle supporting bar 522 is equal to or shorter than the length of the loading space 30 in a back-and-forth direction Y, and in detail may be formed to be shorter. In detail, the length of the middle supporting bar may be ⅓ to ⅔, or ⅖ to ⅘ of the length from the front to the rear.

The middle supporting bar 522 supports a target substrate G from at least one or more points, and the supporting point is exemplified as a middle bearing member 53 described in below, but may support the target substrate by oneself.

The position of the middle supporting bar 522 may become gradually high as being far from a connecting block 522, and thereby the height at one point where a middle supporting bar 522 and a target substrate G meet may be higher compared to a side slot 421 placed in a position neighboring to each other.

This is considered that a middle supporting bar itself may sag slightly as some of the own weight of a target substrate is added to a middle supporting bar 522 at one point where the middle supporting bar 522 meets the target substrate. Additionally, when the middle supporting bar 522 itself is equipped to have a higher height than a side slot 421 placed in a position corresponding to this without such a gradient applied, it may increase a possibility of occurring damage or stain of a target substrate because a contact with a middle supporting bar 522 is caused even in a portion where sag is comparatively small in a target substrate.

That is, some of the own weight of a target substrate is harmoniously dispersed by the middle supporting bar 522 in this manner, and a sag of the target substrate can be more alleviated.

When the middle supporting bar 522 supports a target substrate G from at least one point or more, the variation of the height thereof can be controlled within 3 mm compared to when the middle supporting bar 522 does not support a target substrate G.

For controlling sag to occur within the degree of variation of the height described above in the middle supporting bar 522, the thickness of the middle supporting bar 522 can be modified, and the angle can be modified.

In detail, the middle supporting bar 522 may have a shape in which the area in one side which meets the target substrate is narrower and the area becomes wider as being close to a connecting block 521.

In detail, the middle supporting bar 522 itself or the upper surface thereof may be gradient in a certain angle. The upper surface of the middle supporting member 52 may have an angle at a point which a line from one end combined with the connecting block 521 to the other end contacting with the target substrate and a line parallel to the upper plate or the lower plate meet, and the angle may be 0.1 to 5 degree, or 0.1 to 3 degree. In such a case, a sag of a middle supporting bar 522 can be controlled and a sag of a target substrate G can be more efficiently controlled.

The middle supporting members 52 may be made with aluminum or the like which is coated or not coated, and are being arranged in an up-and-down direction (Z) in a loading space 30. The arranging interval of middle supporting members 52 may be substantially the same with the arranging interval of edge supporting members 42.

The middle bearing member 53 is arranged in an upper surface of a middle supporting bar 522 to protrude to an upper portion and in contact with the center portion of a target substrate G.

The middle bearing members 53 may be arranged in 1, 2, or more with having intervals along a length direction (Y) of a middle supporting bar 522.

The middle bearing member 53 may comprise a buffer covering layer placed on at least a part of the surface thereof.

The middle supporting member 53 may support some of a target substrate of a loading space 30 on a middle supporting member 52 along a length direction (Y) thereof, and the target substrate G may control sag of the target substrate which may occur in a loading space 30.

When a thickness of a target substrate is GT, D1 which is a distance (mm) between one side of the edge supporting member and the middle supporting member can satisfy a below Condition (1) or Condition (2).

When 0.1<$GT$≤0.5,150≤$D1$≤275    Condition (1):

When 0.5<$GT$≤1.5,220≤$D1$≤330    Condition (2):

In further detail when the thickness (mm) of the target substrate is GT, D1 which is a distance (mm) between one side of the edge supporting member and the middle supporting member can satisfy a below Condition (1-1) or Condition (2-1).

When 0.2<$GT$≤0.5,200≤$D1$≤275    Condition (1-1):

When 0.5<$GT$≤1.2,230≤$D1$≤300    Condition (2-1):

The middle supporting member 52 can control the maximum sag of the target substrate based on the edge supporting unit (0 mm) within 3 mm.

A sag which occurs when the middle supporting member 52 supports the target substrate can be controlled within 3 mm based on when the middle supporting member 52 does not support the target substrate (0 mm).

In further detail, the target substrate G may be a glass substrate or a glass substrate in which a through hole is formed, and a thickness of it may be 0.25 to 0.45 mm D1 as a distance between one end within the edge supporting member 42 and the middle supporting member 52 may be applied to be 200 to 275 mm. In such a case, a sag of a target substrate may be controlled within 2 mm, and the target substrate may be stored and moved more stably.

In further detail, the target substrate may be a glass substrate with through holes which has a metal plating layer and/or an insulting layer formed on at least one surface, and the total average thickness may of the target substrate be 0.3 to 1.2 mm, or 0.5 to 0.9 mm D1 as a distance between one end within the edge supporting member and the middle supporting member may be applied to be 230 to 300 mm. In such a case, sag of the target substrate may be controlled within 1 mm, and the target substrate may be stored and moved more stably.

In further detail, the target substrate G may be a glass substrate having a cavity structure or a glass substrate having a cavity structure and through holes, and the thickness of a thick portion not having a cavity structure may be 0.4 to 1 mm, or 0.5 to 0.9 mm. Also, D1 as a distance between one end of the edge supporting member and the middle supporting member may be applied to be 200 to 275 mm. In such a case, a sag of a target substrate may be controlled within 2 mm, and the target substrate may be stored and moved more stably.

In further detail, the target substrate G may be a glass substrate having the cavity structure in which a metal plating layer and/or an insulting layer is formed on at least one surface, and the total average thickness of the target substrate may be 0.5 to 1.3 mm, or 0.7 to 1.2 mm D1 as a distance between one end within the edge supporting member 42 and the middle supporting member 52 may be applied to be 230 to 300 mm. In such a case, a sag of a target substrate may be controlled within 1 mm, and the target substrate may be stored and moved more stably.

A rear stopper 54 is disposed in a loading space 30 and connected to a stopper combining bar 512.

The rear stoppers 54 are arranged along to an up-and-down length direction (Z) of a stopper combining bar 512. Between neighboring rear stoppers 54, a rear slot 541 where a target substrate G is inserted is prepared, and the neighboring rear stoppers 54 are connected from each other. Here, an edge of a rear portion of a target substrate G may be disposed on an upper surface of a rear stopper 54. In addition, the neighboring rear stoppers 54 are connected from each other. Accordingly, the rear part of a target substrate G disposed in a rear slot 541 is not in contact with a stopper combining bar 512. The rear stopper 54 may comprise a buffer covering layer in at least a part of the surface thereof.

A front stopper 60 may comprise a bar member 61, a spacer 62, a rod member 63, and a stopper member 64.

The spacer 62 is protruding to the front by being connected to an edge supporting unit 40 placed in the front.

The spacers 62 may be arranged along an up-and-down direction (Z) of the edge supporting unit 40.

The bar member 61 has a predetermined length and is being connected to the spacer 62.

The bar member 61 faces to the edge supporting unit 40 with having an interval by a spacer 62.

The rod member 63 is being extended to the front from the bar member 61 to the edge supporting unit supporting a target substrate G.

The stopper member 64 faces the front (a thickness surface) of a target substrate G placed in the edge supporting member 42 with protruding to an up-and-down direction (Z) from an end portion of the rod member 63. The front of the target substrate G placed in the edge supporting member 42 is caught by the stopper member 64 and not to be fallen off to the front.

The front stopper 60 may be arranged along an up-and-down direction of the edge supporting unit 40.

The front stopper 60 may comprise a buffer covering layer placed in at least a part of the surface thereof.

The buffer covering layer may be overall placed in portions contacting with a target substrate G loaded in a loading space 30, so that damage of the target substrate G, which can occur in loading or carrying our procedure, can be minimized. Also, when cassette is migrated with taking the target substrate G placed in a loading space 30, a movement or damage of the target substrate G could not occur substantially. Accordingly, a loadability of the target substrate G can be increased and a reliability of the loading cassette can be increased.

The buffer covering layer may comprise PTFE (Poly Tetra Fluoro Ethylene), FEP (Flourinated Ethylene Prophylene), PFA (Per Fluoro Alkoxy), or PEEK (polyaryletherketone), and specifically may comprise PEEK (polyaryletherketone).

The loading cassette 1 according to the present disclosure may further comprise a loading carrier 70 for loading a target substrate G in a loading space 30, or pulling the loaded target substrate G out.

The loading cassette 1 may be one cassette alone, or may be a cassette unit (not shown) formed by stacking the loading cassette 1 in a side direction and/or up-and-down direction. When the cassette unit is formed to be applied to storage and migration of a target substrate, a fixing means (not shown) for fixing the loading cassettes neighboring to each other may be further applied, and the fixing means can be applied without limit if it does not disturb insertion and storage of the target substrate.

The loading carrier 70 is being connected to a robot arm (not shown) or the like, and can fix a target substrate G by an absorption method.

The loading carrier 70 allows the target substrate G to be inserted in a side slot 421 and places it on an edge bearing member 43. On the contrary to this, a target substrate G placed on the edge bearing member 43 is lifted for the loaded target substrate G to be carried out from the loading space 30.

When the loading carrier 70 makes a target substrate G be placed on a depressurizing pad and after that the target substrate G be absorbed, fixed, and moved. For being detached subsequently, a method of releasing a pressure of the depressurizing pad can allow the target substrate G to be separated. In this time, when the depressing pad and the target substrate is not separated properly, compressed air may be added to the depressurizing pad to separate the depressurizing pad and the target substrate more easily.

Loading Cassette 2

With reference to FIGS. 6 to 12, another embodiment of the loading cassette 2 will be described.

FIG. 6 is a perspective view for showing a loading cassette according to one embodiment of the present application, FIG. 7 is a schematic view for showing a target substrate loaded in a loading cassette of FIG. 6, FIG. 8 is a cross sectional view cut along a VIII-VIII line from FIG. 7, FIG. 9 is an enlarged view of A portion of FIG. 8, FIG. 10 is an enlarged view of a rear supporting unit of FIG. 8, and FIG. 11 is an side view for showing a rear supporting unit of FIG. 10. FIG. 12 is a schematic view for showing a state of a rear supporting unit of FIG. 11 supporting a target substrate.

With reference to FIGS. 6 to 12, a loading cassette 2 according to another example embodiment comprises an upper plate 10, a lower plate 20, an edge supporting unit 40 and a rear supporting unit 50. Here, the upper plate 10 and the lower plate 20 is same as an upper plate and a lower plate of a loading cassette 1 described above according to FIGS. 1 to 7, and thus the further description is omitted.

An edge supporting unit 40 comprises a side frame 41, an edge supporting member 42, and an edge bearing member 43. And a rear supporting unit 50 comprises a rear frame 51, a middle supporting member 52, and a middle bearing member 53.

The side frame 41 connects the upper plate 10 and the lower plate 20. And a surface of the side frame 41 connected to a loading space 30, side inserting slots 411 are formed in a back-and-forth direction (Y). The side inserting slots 411 are formed in plurality with having intervals along an up-and-down length direction (Z) of a side frame 41.

The edge supporting member 42 is combined to the side inserting slots 411 and protruding to a loading space 30.

An upper surface and a side surface of the edge supporting member 42 faces to a target substrate G.

The edge bearing member 43 protrudes from the upper surface of the edge supporting member 42 to an upper portion.

The edge bearing members 43 are arranged along a length direction (Y) of the edge supporting member 42.

The edge bearing member 43 may comprise a buffer covering layer placed in at least a part of the surface thereof. The edge supporting member 42 may also comprise a buffer covering layer placed in at least a part of the surface thereof.

Such an edge supporting unit 40 has a composition and an acting effect corresponding to the edge supporting unit according to embodiments of FIGS. 1 to 7 and thus the further description is omitted.

A rear supporting unit 50 may comprise a rear frame 51, a middle supporting member 52, and a middle bearing member 53.

The rear frame 51 connects an upper plate 10 and a lower plate 20. In a surface of the rear frame 51 connected to a loading space 30, rear inserting slots 513 may be formed in a left-and-right direction (X). Here, a side inserting slot 411 and a rear inserting slot 513 may be formed in the same position based on the lower plate 20.

The middle supporting member 52 is combined with the rear inserting slot 513 and protrudes in a front direction from the rear frame 51.

The middle supporting member 52 may face to a sagged portion of a target substrate G, and for example, may face to the center portion.

The middle supporting member 52 may have a first area portion 523 and a second area portion 524 whose area is narrower than the first area portion 523. Here, the length of the second area portion 524 may be longer than the length of the first area portion 523.

The total length of the middle supporting member 52 may be one-half or more of the front-and-rear length of a target space 30.

The gradient of the middle supporting member 52 may be gradient in a lower direction from the second area portion 524 to the first area portion 523. That is, the middle supporting member 52 may have a gradually gradient shape to a lower direction from the front to the rear. In this case, even though a sag of a target substrate occurs, a portion directly contacting with the middle supporting member 52 can be reduced, and the possibility of occurring damage of the target substrate can be reduced.

The upper surface of the middle supporting member 52 may have gradient in a certain angle. In detail, the upper surface of the middle supporting member 52 may have an angle at a point where a line one end combined with the rear inserting slot 513 and the other end contacting with the target substrate and a line parallel to the upper plate or the lower plate meet, and the angle may be 0.1 to 10 degree, 0.1 to 5 degree, or 0.1 to 3 degree.

The middle bearing member 53 is protruding from an upper surface of the middle supporting member 52.

The middle bearing members 53 are being arranged with having intervals along a length direction (Y) of the middle supporting member 52.

The middle bearing member 53 may contact a target substrate G and thereby directly support the center portion of the target substrate G.

The middle bearing member 53 can support the center portion of a target substrate G through the middle supporting member 52 and thereby prevent the center portion of a target substrate G from sag by the own weight.

Various characteristics found in embodiments illustrated in FIGS. 1 to 5 also can be applied to the present embodiment.

The loading cassettes (1 or 2) may further comprise a protecting housing (not shown) for surrounding the edge supporting unit.

The protecting housing may have a shape of surrounding at least one between the upper plate and the lower plate, and the edge supporting unit.

The protecting housing may be an overall rectangular shape in which one surface is opened and may be covered on the loading cassette.

The protecting housing may further comprise a housing opening and shutting part (not shown) which allows a glass substrate to enter and can be opened and shut in a part or the whole within a surface surrounding the edge supporting unit.

The protecting housing may serve as preventing function from foreign material to be mixed when the loading cassette moves in a state of loading glass substrates and blocking the possibility of being damaged by flow of the fluid in a glass substrate.

Additionally, the protecting housing may serve as a preventing role being damaged of the inside of another loading cassette or the loaded glass substrate even though some glass substrate of any one loading cassette is damaged when many loading cassettes have been loaded to be moved or stacked.

As a material of the protecting housing, a material which is excellent in impact resistance, heat resistance, acid resistance, and so on and endures the weight of a glass substrate and a cassette, specifically a polycarbonate material which is clear or non-clear may be applied, and this case is advantageous in having a sufficient strength and excellent dimensional stability.

Loading Method of a Target Substrate

A method of loading a target substrate according to another embodiment comprises a carry-in step; a support step; and a completion step.

A method of loading a target substrate is performed through the above described a loading cassette (1 or 2) and a loading carrier 70 below.

The carry-in step is a step that a target substrate G is moved by applying a loading carrier 70 having two or more hands 72.

The target substrate G may be a glass substrate having many through holes or a substrate for semiconductor packaging in which an electrically conductive pattern and an insulating layer are laminated to the glass substrate.

The target substrate G generally has a thin thickness (in general, 1500 μm or less) and thereby can be easily bended or curved. Also, because a glass substrate in which a through hole (core via) is formed in the predetermined size and position is applied as a target substrate, stress is concentrated in some section, imbalanced stress may occur in the glass substrate overall, and this may induce degradation of mechanical strength of the substrate. Accordingly, it is required to transfer and store a target substrate stably with minimizing sag or bending of the target substrate. And this is more important when applying a substrate with a larger area.

The target substrate G may be a polygonal glass substrate having L as the length (mm) and W as the width (mm). The L and W may be respectively 400 mm or more, and the target substrate may, for example, comprise a glass substrate in a quadrangle shape.

In the carry-in step, a target substrate G is moved with controlling to occur variation predetermined or less. In detail, the variation is calculated by below Equation (1) (refer to FIG. 1).

Variation ($D$)=Inside Height of Target Substrate ($H$in,mm)−Outside Height of Target Substrate ($H$out,mm)     Equation (1):

The inside height and the outside height of the target substrate is applied by measuring height at the same reference line (B).

The variation (D) may be within −15 to +10 mm, −10 to 7 mm, or −10 to 4 mm A variation in this range may be adjusted by changing the number of hands to be applied, and the position and the interval of the hand fork.

The hands 72 respectively have one or more hand forks 72a and may have Wa2 (mm) as the shortest interval between hand forks 72a placed in the hands 72 which respectively satisfies below Condition (1) or Condition (2). GT refers to the thickness (mm) of the target substrate.

When $0.1<GT\leq0.5, (W/3.4)\leq Wa2\leq(W/1.8)$     Condition (1):

When $0.5<GT\leq1.5, (W/2.3)\leq Wa2\leq(W/1.6)$     Condition (2):

Also, the Wa2 (mm) may respectively satisfy below Condition (1-1) or Condition (2-1).

When $0.1<GT\leq0.5, (W/2.5)\leq Wa2\leq(W/1.9)$     Condition (1-1):

When $0.5<GT\leq1.5, (W/2.2)\leq Wa2\leq(W/1.8)$.     Condition (2-1):

When the thickness (mm) of the target substrate is expressed as GT, Wa1 value which is an interval between hand forks 72a placed on the same hand 72 may satisfy below Condition (3) or Condition (4).

When $0.1<GT\leq0.5, (L/3.4)\leq Wa1\leq(L/1.8)$     Condition (3):

When $0.5<GT\leq1.5, (W/2.3)\leq Wa1\leq(W/1.6)$.     Condition (4):

Also, the Wa1 value may satisfy below Condition (3-1) or Condition (4-1).

When $0.1<GT\leq0.5, (L/2.5)\leq Wa1\leq(L/1.9)$     Condition (3-1):

When $0.5<GT\leq1.5, (L/2.2)\leq Wa1\leq(L/1.8)$     Condition (4-1):

When these interval conditions of the hand forks 72a are satisfied, it is possible to move a target substrate more stably.

The target substrate G is carried in a loading space 30 of a loading cassette (1 or 2) with maintaining the variation (D) within a range described above, and the left and right edges of the target substrate is placed on the edge supporting unit 40 of the loading cassettes, thereby allowing the entire target substrate to enter and be placed inside the loading space 30. This entrance may be controlled by a loading carrier and hands moving along a predetermined moving route.

For example, the result of a fork test performed with a glass substrate in which has through vias will be disclosed. The glass substrate had a size of 508×508 (length×width, mm) and a thickness of 0.3 to 0.7 mm was formed.

It was confirmed that, when a fork interval is 220 mm based on a glass substrate with through vias, a variation (inside height-outside height) is 4.7 mm; when a fork interval is 260 mm based on a glass substrate with through vias, a variation is −0.6 mm; when a fork interval is 270 mm, a variation is −1 mm; when a fork interval is 320 mm, a variation is −11 mm; and when a fork interval is 420 mm, a variation is −27.5 mm.

On the other hand, the result of a test based on a glass substrate in which a through via is not formed was; when a fork interval is 220 mm, a variation (inside height-outside height) is 4.9 mm; when a fork interval is 270 mm, a variation is −0.4 mm; when a fork interval is 320 mm, a variation is −5.1 mm; and when a fork interval is 420 mm, a variation is −17.1 mm.

Considering the above, it is confirmed that a glass substrate in which has through via occurs a larger sag and a variation of the sag is rapidly increased according to applying a larger fork interval, compared to a glass substrate in which a through via is not formed. Additionally, it is thought that a main occurring reason of the increased variation is originated in variation of inside height, and this is thought to originate in changing of various causes such as weight of a glass substrate, area moment of inertia, and so on. However, the above results are the results of tests targeting a glass substrate which has core vias. An electrically conductive layer such as a metal pattern or an insulating layer may be formed to the glass substrate asymmetrically depending on a design, and in this case a result slightly different to the above.

The support step is a step of controlling a maximum sag of a target substrate G within 3 mm by supporting the target substrate in at least one point or more of the middle thereof by a middle supporting member 52. A sag is determined by an interval from an edge supporting unit 40 (basement, 0 mm) The maximum sag may be negative, but it is expressed by converting to be positive.

In the support step, a maximum sag of the target substrate may be controlled by adjusting D1. The D1 is a distance between one side of the edge supporting member 42 and a middle supporting member 52

In detail, when a thickness of a target substrate is GT, D1 can satisfy below condition (5) or (6).

When $0.1 < GT \leq 0.5, 150 \leq D1 \leq 275$　　　　Condition (5):

When $0.5 < GT \leq 1.5, 220 \leq D1 \leq 330$　　　　Condition (6):

In further detail when the thickness (mm) of the target substrate is GT, D1 can satisfy below conditions (5-1) to (6-1).

When $0.2 < GT \leq 0.5, 200 \leq D1 \leq 275$　　　　Condition (5-1):

When $0.5 < GT \leq 1.2, 230 \leq D1 \leq 300$　　　　Condition (6-1):

When applying a middle supporting member 52, it is advantageous to control a maximum sag of a target substrate within 3 mm based on the edge supporting member (0 mm).

The middle supporting member 52 may comprise a middle supporting bar 522. The middle supporting bar 522 has one portion which a middle bearing member 53 may be placed at and the other portion which is placed close to the rear frame 51. And the middle supporting bar 522 have a gradient, which the one portion is placed to be higher than the other portion. Also, in the support step, the height of the middle bearing member may be changed within 3 mm based on a height compared to not supporting the target substrate (0 mm) It may bring it to conduct a stabler supporting role.

The completion step is for releasing the fixation of the loading carrier 70 with the target substrate G and carrying out the loading carrier to external of the loading cassette (1 or 2.)

A hand 72 of the loading carrier has a hand fork 72a placed in a portion directly contacting with the target substrate, and the hand fork may have a pressure adjusting mean (not shown) selectively. In detail the hand fork may be adjusted to inhale or exhale air by being connected to a pressure controlling device (not shown) separately prepared through the hand. For example, in a case for fixing the target substrate, the target substrate can be fixed on a hand by depressurizing with letting the hand fork contact with the target substrate and inhale air. In the completion case, a force of fixing the target substrate is removed from the hand fork by relieving depressurizing state and the hand fork is allowed to exhale air temporarily to separate the hand fork and the target substrate easily.

The loading cassette (1 or 2) comprise multiple edge supporting units 40. When the thickness of the target substrate is expressed as GT (unit: mm), a distance between the edge supporting units neighboring up and down to each other is Dh (unit: mm) Dh may satisfy below Equation (2).

$$25 + (GT - 0.8) * 8 \leq Dh \qquad \text{Equation (2):}$$

The Dh may be 40 mm or less, or 35 mm or less for efficiency of loading.

Loading Method of a Target Substrate

A method of loading a target substrate according to another embodiment comprises, an entering step for carrying in a target substrate comprising a glass substrate with or without a through hole to a loading space of a loading cassette;

a supporting step for moving the entire target substrate to be placed inside the loading space and have left and right edges of the target substrate being placed on the edge supporting unit of the loading cassette by fixing the target substrate to a loading carrier, wherein at least one point or more of the middle of the target substrate supports at least a part of own weight of the target substrate though being placed on the middle supporting member; and a completing step for releasing the fixation of the loading carrier and the target substrate.

In the supporting step and the completing step, the maximum sag of the target substrate based on the edge supporting unit (0 mm) is controlled within 3 mm.

In detail, the method of loading the target substrate loads the target substrate by comprising an entering step for carrying in a target substrate fixed on a depressurizing pad (not shown) to a loading space to be placed in an edge supporting unit 40; and a supporting step for releasing pressure of the depressurizing pad and letting the left and right edges of the target substrate to be placed in the edge supporting unit 40, wherein at least one point or more of the middle of the target substrate is supported by the middle supporting member supporting member 52.

The target substrate is the same as above description in that it is a substrate comprising a glass substrate with or without a through hole.

When the thickness (mm) of the target substrate is expressed as GT, D1 which is a distance (mm) between one side of the edge supporting member and the middle supporting member may satisfy below Condition (1) or Condition (2).

When $0.1 < GT \leq 0.5, 150 \leq D1 \leq 275$      Condition (1):

When $0.5 < GT \leq 1.5, 220 \leq D1 \leq 330$      Condition (2):

The middle supporting member 52 can control the maximum sag of a target substrate based on the edge supporting unit (0 mm) within 3 mm.

The target substrate G may be supported by at least one surface contacting the gradient middle supporting member 52 from at least one point.

In the supporting step, sag occurring when the middle supporting member 52 supports the target substrate can be controlled within 3 mm based on when the middle supporting member 52 does not support the target substrate (0 mm).

The middle supporting member may comprise a middle supporting bar. The middle supporting bar has one portion which a middle bearing member may be placed at and the other portion which is placed close to the rear frame. And the middle supporting bar 522 has a gradient, which the one portion is placed to be higher than the other portion. Also, in the support step, the height of the middle bearing member may be changed within 3 mm based on a height compared to not supporting the target substrate (0 mm.)

Hereinafter, while embodiments of the present disclosure will be described in more detail with reference to the accompanying examples, it should be noted that examples are not limited to the following.

Comparative Example—Loading of a Glass Substrate Formed Through Vias Using a Loading Cassette without a Middle Supporting Member As a target substrate, a glass substrate G was prepared, whose length and breadth were 500 mm respectively, thickness was about 0.4 mm, and the glass substrate was formed through vias as diameter of 100 μm and their pits of 1 mm.

Next, as a loading cassette, comprising
an upper plate;
a lower plate facing to the upper plate with an interval;
a loading space between the upper plate and the lower plate and a target substrate being disposed in,
an edge supporting unit for connecting the upper plate and the lower plate and supporting left and right edges of the target substrate, and
a rear supporting unit for connecting the upper plate and the lower plate and supporting a rear edge of the target substrate,
was prepared.

And then, the prepared glass substrate was carried into the loading space through a loading carrier, and stayed for 24 hours.

In this case, both left and right edges of the glass substrate were supported by edge supporting members, not applying middle supporting members, and a sag at the center of the glass substrate as a target substrate was occurred 30 mm or more.

Example—Loading of a Glass Substrate Formed Through Vias Using a Loading Cassette As a glass substrate G, the same one applied in the comparative example were prepared.

Next, as a loading cassette, comprising
an upper plate 10;
a lower plate 20 facing to the upper plate with an interval;
a loading space 30 between the upper plate and the lower plate and a target substrate being disposed in,
an edge supporting unit 40 for connecting the upper plate and the lower plate and supporting left and right edges of the target substrate, and
a rear supporting unit 50 for connecting the upper plate and the lower plate and supporting a rear edge of the target substrate,
wherein the rear supporting unit 50 comprises a rear frame 51 being connecting the upper plate 10 and the lower plate 20 in a rear surface and a middle supporting member 52 being protruding to the front direction from the rear frame, was prepared.

And then, the prepared glass substrate was carried into the loading space through a loading carrier 70, and stayed for 24 hours.

In this case, at both a space between left right edge of the glass substrate and the middle supporting member; and a space between the middle supporting member and right edge of the glass substrate were occurred sages of the glass substrate, the degree occurred sages were confirmed as about 0.9 mm and about 1 mm, respectively. Therefore, it was confirmed that the seg of the glass substrate is controlled well.

Although the preferable exemplary embodiments have been described in detail, the scope of the embodiment is not limited thereto, and modifications and alterations made by those skilled in the art using the basic concept of the embodiment defined in the following claims fall within the scope of the embodiment.

DESCRIPTION OF FIGURE NUMBERS

| | |
|---|---|
| 1, 2: loading cassette | 10: upper plate |
| 20: lower plate | 30: loading space |
| 40: edge supporting unit | 41: side frame |
| 411: side inserting slot | 42: edge supporting member |
| 421: side slot | 43: edge bearing member |
| 50: rear supporting unit | 51: rear frame |
| 511: rear main bar | 511a: holding slot |
| 512: stopper combining bar | 513: rear inserting slot |
| 52: middle supporting member | 521: connecting block |
| 522: middle supporting bar | 523: first area portion |
| 524: second area portion | 53: middle bearing member |
| 54: rear stopper | 541: rear slot |
| 60: front stopper | 61: bar member |
| 62: spacer | 63: rod member |
| 64: stopper member | 70: loading carrier |

What is claimed is:

1. A loading cassette, comprising
an upper plate,
a lower plate facing to the upper plate with an interval,
a loading space between the upper plate and the lower plate and a target substrate being disposed in,
an edge supporting unit for connecting the upper plate and the lower plate and supporting left and right edges of the target substrate, and a rear supporting unit for connecting the upper plate and the lower plate and supporting a rear edge of the target substrate, wherein the rear supporting unit comprises a rear frame being connecting the upper plate and the lower plate in a rear surface and a middle supporting member being protruding to the front direction from the rear frame, the target substrate is a substrate including a glass substrate which includes or does not include a through hole, and the middle supporting member controls a maximum sag of the target substrate based on the edge supporting unit (as 0 mm) within 3 mm.

2. The loading cassette according to claim 1, wherein, when a thickness (mm) of the target substrate is GT, D1 is a distance (mm) between one side of the edge supporting member and the middle supporting unit and the D1 satisfies below Condition (1) or Condition (2);

When $0.1 < GT \leq 0.5, 150 \leq D1 \leq 275$      Condition (1):

When $0.5 < GT \leq 1.5, 220 \leq D1 \leq 330$.      Condition (2):

3. The loading cassette according to claim 1, wherein the middle supporting member comprises a middle supporting bar, the middle bearing member is disposed at one part of the middle supporting member, and the rear frame is near to other part of the middle supporting member, the middle bearing member is disposed to have gradient to be higher than the other part.

4. The loading cassette according to claim 1, wherein the edge supporting unit comprises a side frame being connecting the upper plate and the lower plate in both left and right sides respectively, and an edge supporting member forming a side slot disposed in the rear frame to support the left and right edges of the target substrate and not allowing the target substrate to contact the side frame, wherein the side slot is formed in plurality along an up-and-down direction of the side frame with having intervals.

5. The loading cassette according to claim 1, wherein the middle supporting member comprises a connecting block combined with the rear frame, and a middle supporting bar being protruding to the front from the connecting block, wherein the left-and-right width of the middle supporting bar is narrower as being distant from the connecting block, wherein the middle bearing member is disposed in the middle supporting bar in a number of one, two, or more.

6. The loading cassette according to claim 1, wherein a length of the middle supporting bar may be ⅓ to ⅔ of the back-and-forth length of the loading space.

7. The loading cassette according to claim 1, wherein the rear supporting unit comprises a rear frame being connecting the upper plate and the lower plate at the rear surface and having rear inserting slots formed in a left-and-right direction, a middle supporting member being protruding to the front direction from the rear frame and being combined with the rear inserting slots and having a first area portion and a second area portion, and a middle bearing member being protruding from the upper surface of the middle supporting member and directly connecting the target substrate to control sag of the target substrate, wherein the first area portion is connected to the rear frame and the area of the second area portion may be narrower than the area of the first area portion.

8. A method of loading a target substrate, comprising an entering step for carrying in a target substrate to a loading space of a loading cassette;

a supporting step for moving the entire target substrate by fixing at a loading carrier to the loading space with left and right edges of the target substrate placed on an edge supporting unit of the loading cassette according to claim 1 and controlling a maximum sag of the target substrate to be within 3 mm based on the edge supporting unit (as 0 mm) by supporting the target substrate with a middle supporting member in at least one point or more of the middle; and a completing step for releasing the fixation of the loading carrier and the target substrate, wherein the target substrate comprises a glass substrate with or without a through hole, and when the thickness (mm) of the target substrate is expressed as GT, D1 which is a distance (mm) between one side of the edge supporting member and the middle supporting member satisfies below Condition (1) or Condition (2);

When $0.1 < GT \leq 0.5, 150 \leq D1 \leq 275$      Condition (1):

When $0.5 < GT \leq 1.5, 220 \leq D1 \leq 330$.      Condition (2):

9. A method of loading a target substrate, comprising a carry-in step for allowing the entire target substrate to enter and be disposed inside a loading space, in which the target substrate is polygonal having L as the length (mm) and W as the width (mm) is carried in the loading space of a cassette, by applying a loading carrier having two or more hands with maintaining variation (D) indicated by below Formula (1) within −15 to +10 mm;

a support step for controlling a maximum sag of the target substrate to be within 3 mm based on the edge supporting unit (as 0 mm) by supporting the target substrate with a middle supporting member in at least one point or more of the middle; and a completion step of releasing the fixation of the loading carrier and the target substrate and then taking out the loading carrier to the external of the loading cassette, wherein the target substrate is a glass substrate having many through holes or a substrate for semiconductor packaging in which an electrical conductive pattern and an insulating layer are laminated to the glass substrate, and when a thickness (mm) of the target substrate is GT, the hands have one or more hand forks respectively and Wa2 (mm) is the shortest interval between hand forks placed on different hands; and below Condition (1) or Condition (2) is satisfied;

Variation (D)=Inside Height of Target Substrate (Hin,mm)−Outside Height of Target Substrate (Hout,mm)      Equation (1):

When $0.1 < GT \leq 0.5, (W/3.4) \leq Wa2 \leq (W/1.8)$      Condition (1):

When $0.5 < GT \leq 1.5, (W/2.3) \leq Wa2 \leq (W/1.6)$.      Condition (2):

10. A method of loading a target substrate according to claim 9,
   wherein, when the thickness (mm) of the target substrate is GT, Dh (mm) which is an interval between the edge supporting units neighboring to each other in up and down satisfies below Formula (2);

$$25+(GT-0.8)*8 \leq Dh. \qquad \text{Equation (2):}$$

\* \* \* \* \*